(12) United States Patent
Fang et al.

(10) Patent No.: US 10,224,301 B2
(45) Date of Patent: Mar. 5, 2019

(54) SEMICONDUCTOR PACKAGE DEVICE AND METHOD OF MANUFACTURING THE SAME

(71) Applicant: Advanced Semiconductor Engineering, Inc., Kaohsiung (TW)

(72) Inventors: Jen-Kuang Fang, Kaohsiung (TW); Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/642,005

(22) Filed: Jul. 5, 2017

(65) Prior Publication Data

US 2019/0013284 A1   Jan. 10, 2019

(51) Int. Cl.
*H01L 23/00* (2006.01)
*H01L 23/055* (2006.01)
(Continued)

(52) U.S. Cl.
CPC ............ *H01L 24/13* (2013.01); *B23K 35/025* (2013.01); *H01L 23/055* (2013.01); *H01L 24/11* (2013.01); *H01L 25/0657* (2013.01); *B23K 2101/40* (2018.08); *H01L 2224/1132* (2013.01); *H01L 2224/13024* (2013.01); *H01L 2224/13239* (2013.01); *H01L 2224/13244* (2013.01); *H01L 2224/13247* (2013.01); *H01L 2224/13269* (2013.01); *H01L 2224/13561* (2013.01); *H01L 2224/13583* (2013.01); *H01L 2224/13611* (2013.01); *H01L 2224/13639* (2013.01); *H01L 2224/13644* (2013.01); *H01L 2224/13647* (2013.01); *H01L 2224/13655* (2013.01);
(Continued)

(58) Field of Classification Search
CPC ....... H01L 24/13; H01L 23/055; H01L 24/11; H01L 25/0657; H01L 2225/06558; H01L 2224/13647; H01L 2224/13239; H01L 2225/06513; H01L 2225/06582; H01L 2225/06572; H01L 2224/13244; H01L 2224/13669; H01L 2224/13024; H01L 2224/13247; H01L 2224/13269; H01L 2224/13639; H01L 2224/13655; H01L 2224/1132; H01L 2224/13684; B23K 35/025; B23K 2201/40
See application file for complete search history.

(56) References Cited

U.S. PATENT DOCUMENTS 4,740,657 A * 4/1988 Tsukagoshi ............... H01B 1/22
                                              174/84 R
4,988,669 A * 1/1991 Dersch .................. H01L 39/143
                                              174/125.1
(Continued)

*Primary Examiner* — Victor A Mandala
(74) *Attorney, Agent, or Firm* — Foley & Lardner LLP; Cliff Z. Liu

(57) ABSTRACT

A semiconductor package device includes a carrier, a first electronic component, and a conductive element on the carrier. The first electronic component is over the carrier. The conductive element is on the carrier and electrically connects the first electronic component to the carrier. The conductive element includes at least one conductive particle and a solder material covering the conductive particle, and the conductive particle includes a metal core, a barrier layer covering the metal core, and a metal layer covering the barrier layer.

18 Claims, 28 Drawing Sheets

(51) Int. Cl.
  *H01L 25/065* (2006.01)
  *B23K 35/02* (2006.01)
  *B23K 101/40* (2006.01)
(52) U.S. Cl.
  CPC .............. *H01L 2224/13666* (2013.01); *H01L 2224/13669* (2013.01); *H01L 2224/13684* (2013.01); *H01L 2225/06513* (2013.01); *H01L 2225/06558* (2013.01); *H01L 2225/06572* (2013.01); *H01L 2225/06582* (2013.01)

(56) References Cited

U.S. PATENT DOCUMENTS

| | | | |
|---|---|---|---|
| 2002/0005247 A1* | 1/2002 | Graham | C09J 9/02 156/291 |
| 2004/0224441 A1* | 11/2004 | Saito | H01L 24/11 438/119 |
| 2012/0267782 A1* | 10/2012 | Chen | H01L 25/105 257/738 |
| 2012/0314384 A1* | 12/2012 | Woychik | H01L 21/76898 361/752 |
| 2013/0076347 A1* | 3/2013 | Toshida | G01R 33/10 324/219 |
| 2014/0370704 A1* | 12/2014 | Ahn | H01L 21/02203 438/666 |
| 2015/0208509 A1* | 7/2015 | Sakai | H05K 3/323 361/751 |
| 2015/0223347 A1* | 8/2015 | Elger | B23K 35/262 228/248.1 |
| 2015/0236230 A1* | 8/2015 | Miyata | H01L 33/62 257/98 |
| 2015/0279805 A1 | 10/2015 | Karhade et al. | |
| 2016/0204313 A1* | 7/2016 | Namiki | H01L 33/62 257/99 |
| 2018/0082971 A1* | 3/2018 | Lin | H01L 24/29 |

* cited by examiner

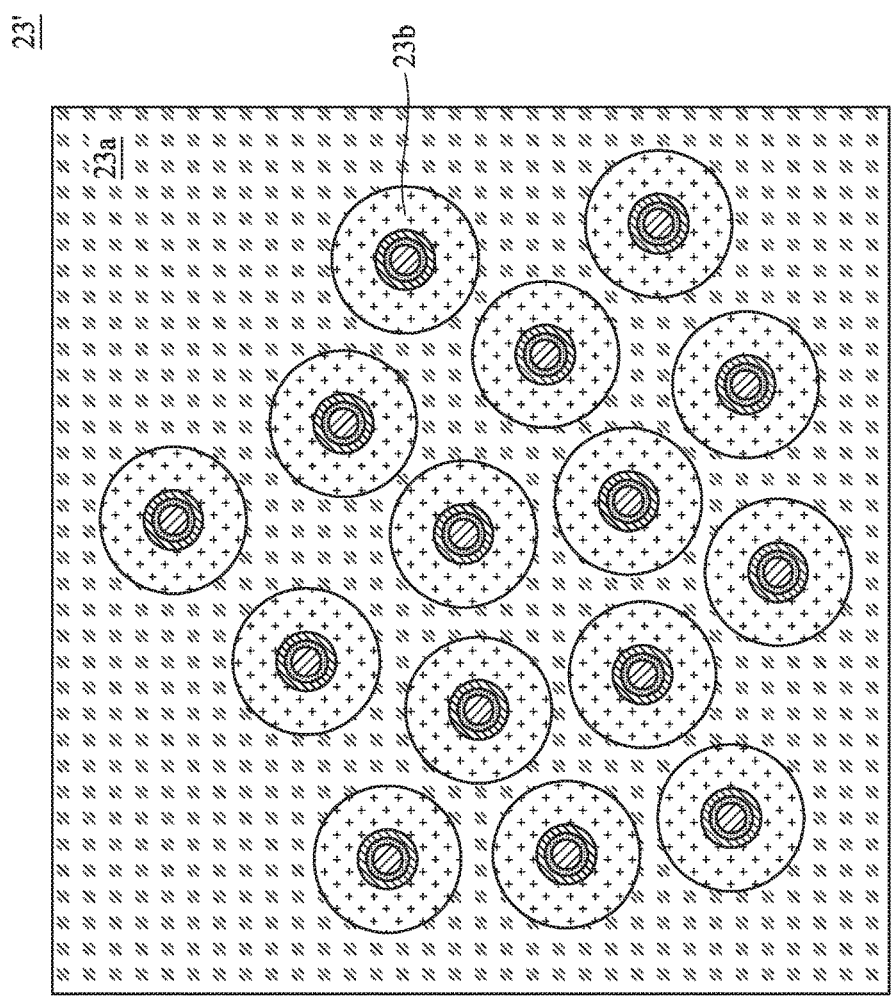

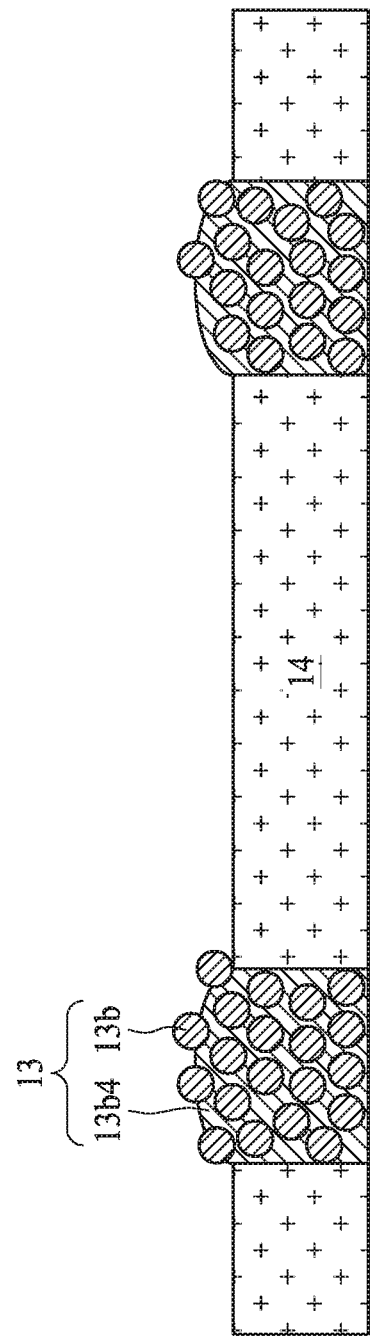

SEMICONDUCTOR PACKAGE DEVICE AND METHOD OF MANUFACTURING THE SAME

BACKGROUND

1. Technical Field

The present disclosure relates generally to a semiconductor package device and a method of manufacturing the same. More particularly, the present disclosure relates to a semiconductor package device including conductive pillars and a method of manufacturing the same.

2. Description of the Related Art

Conductive pillars are widely used for interconnection between a die and a substrate or between a substrate and another substrate. In comparable techniques, the conductive pillars are commonly formed by electroplating. However, the electroplating technique increases the cost and time for manufacturing conductive pillars.

SUMMARY

In one or more embodiments, a conductive particle includes a metal core, a barrier layer, a first conductive layer, and a second conductive layer. The barrier layer surrounds the metal core. The first conductive layer surrounds the barrier layer. The second conductive layer surrounds the first conductive layer.

In one or more embodiments, a semiconductor package device includes a carrier, a first electronic component, and a conductive element on the carrier. The first electronic component is over the carrier. The conductive element is on the carrier and electrically connects the first electronic component to the carrier. The conductive element includes at least one conductive particle and a solder material covering the conductive particle, and the conductive particle includes a metal core, a barrier layer covering the metal core, and a metal layer covering the barrier layer.

In one or more embodiments, a semiconductor device package includes a carrier and a conductive element. The carrier has a first surface and includes a conductive pad on the first surface of the carrier. The conductive element includes a plurality of conductive particles surrounded by a solder material, and the conductive element is disposed on the conductive pad of the carrier, wherein a portion of the conductive element is covered by the conductive pad.

In one or more embodiments, a semiconductor device package includes an electronic component, a conductive element, and a first package body. The conductive element is on the electronic component, and the conductive element has a lateral surface and a plurality of depressions on the lateral surface. The first package body encapsulates the conductive element and extends into the depressions.

In one or more embodiments, a method of manufacturing a semiconductor package includes providing an RDL; disposing an insulating layer on the RDL, the insulating layer having an opening; and disposing a conductive element by filling a paste including at least one conductive particle into the opening, wherein the conductive particle includes a solder layer encapsulating a metal core.

BRIEF DESCRIPTION OF THE DRAWINGS

Aspects of the present disclosure are best understood from the following detailed description when read with the accompanying figures. It is noted that various features may not be drawn to scale, and the dimensions of the various features may be arbitrarily increased or reduced for clarity of discussion.

FIG. 3A illustrates a composition of a paste shown in FIG. 2B in accordance with some embodiments of the present disclosure;

FIG. 4A, FIG. 4B and FIG. 4C illustrate different types of conductive pillars in accordance with some embodiments of the present disclosure;

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
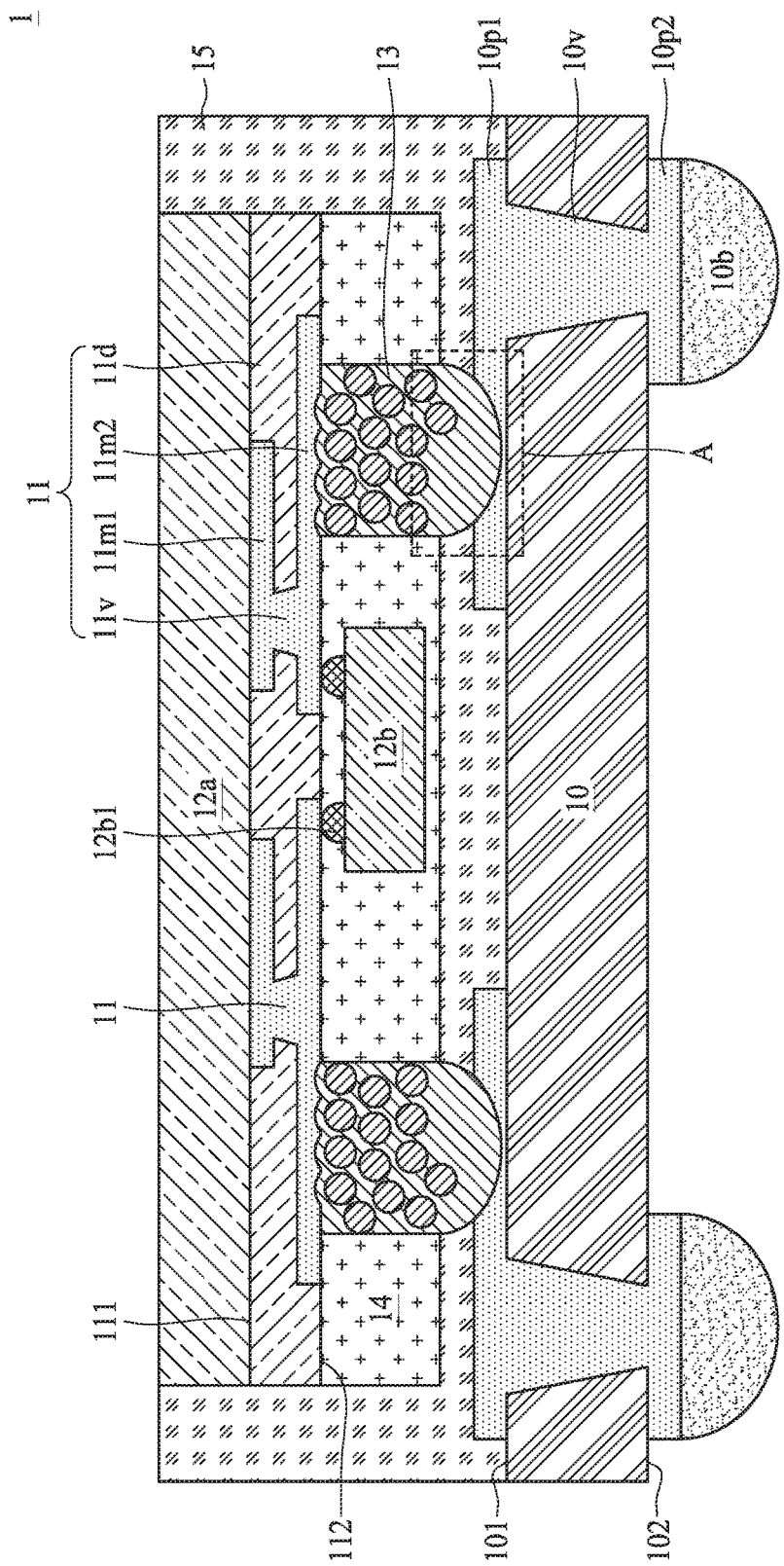
FIG. 1A illustrates a cross-sectional view of a semiconductor package device in accordance with some embodiments of the present disclosure.

FIG. 1A illustrates a cross-sectional view of a semiconductor package device 1 in accordance with some embodiments of the present disclosure. The semiconductor package device 1 includes a substrate (or carrier) 10, a redistribution layer (RDL) 11, electronic components 12a, 12b, one or more conductive pillars (or conductive elements) 13 and isolation layers (or package bodies) 14, 15.

In some embodiments, the RDL 11 includes a dielectric layer 11d and conductive layers 11m1, 11m2 (or metal layers) encapsulated or covered by the dielectric layer 11d. The conductive layers 11m1, 11m2 are electrically connected through conductive interconnections 11v (e.g., vias). In some embodiments, the RDL 11 may include any number of dielectric layers and conductive layers according to several different embodiments. For example, the RDL 11 may include N dielectric layers and conductive layers, where N is an integer. The conductive layer 11m1 is exposed from the dielectric layer 11d to provide electrical connections on a first surface 111 (also referred to as a top surface) of the RDL 11. The conductive layer 11m2 is exposed from the dielectric layer 11d to provide electrical connections on a second surface 112 (also referred to as a bottom surface) of the RDL 11.

The electronic component 12a is disposed on the first surface 111 of the RDL 11 and electrically connected with the conductive layer 11m1. The electronic component 12a may be a die or a chip including a semiconductor substrate, one or more integrated circuit devices and one or more overlying interconnection structures therein. The integrated circuit devices may include active devices, such as transistors, and/or passive devices, such as resistors, capacitors, inductors, or a combination thereof.

The electronic component 12b is disposed on the second surface 112 of the RDL 11 and electrically connected with the conductive layer 11m2 through electrical or conductive contacts 12b1 (e.g., solder balls). In some embodiments, the electronic component 12b is electrically connected with the electronic component 12a through the RDL 11. The electronic component 12b may be a die or a chip including a semiconductor substrate, one or more integrated circuit devices and one or more overlying interconnection structures therein. The integrated circuit devices may include active devices, such as transistors, and/or passive devices, such as resistors, capacitors, inductors, or a combination thereof.

The conductive pillar 13 is disposed on the second surface 112 of the RDL 11 and electrically connected with the electronic component 12a or the electronic component 12b through the RDL 11. In some embodiments, the conductive pillar 13 may be a sphere pillar or a cube pillar depending on different embodiments.

The isolation layer 14 is disposed on the second surface 112 of the RDL 11 and covers a portion of the second surface 112 of the RDL 11, the electronic component 12b and a first portion of the conductive pillar 13. A second portion of the conductive pillar 13 is exposed from the isolation layer 14. In some embodiments, the isolation layer 14 includes, for example, organic materials (e.g., molding compound, Bismaleimide Triazine (BT), Polyimide (PI), Polybenzoxazole (PBO), solder resist, Ajinomoto build-up film (ABF), Polypropylene (PP) or epoxy-based material), inorganic materials (e.g., silicon, glass, ceramic or quartz), liquid and/or dry-film materials or a combination thereof. A melting point of the conductive pillar 13 may be greater than a melting point of the conductive contacts 12b1.

The exposed portion (e.g., the second portion) of the conductive pillar 13 is disposed on a surface 101 (also referred to as a first surface or a top surface) of the substrate 10 and electrically connected to a conductive pad 10p1 on the surface 101 of the substrate 10. The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as an RDL or a grounding element. The substrate 10 has a surface 102 (also referred to as a second surface or a bottom surface) opposite to the surface 101. The conductive pad 10p1 on the first surface 101 of the substrate 10 is electrically connected to a conductive pad 10p2 on the second surface 102 of the substrate 10 through a conductive via 10v within the substrate 10. The electrical contact 10b (e.g., controlled collapse chip connection (C4) pad) is disposed on the conductive pad 10p2 to provide electrical connections between the substrate 10 and external devices.

The isolation layer 15 is disposed on the first surface 101 of the substrate 10 and covers substantially coplanar lateral surfaces defined by the electronic component 12a, the RDL 11 and the isolation layer 14, and the second portion of the conductive pillar 13. In some embodiments, the isolation layer 15 can cover a portion of the first surface 111 of the RDL 11. In some embodiments, the isolation layer 15 includes, for example, organic materials (e.g., molding compound, BT, PI, PBO, solder resist, ABF, PP or epoxy-based material), inorganic materials (e.g., silicon, glass, ceramic or quartz), liquid and/or dry-film materials or a combination thereof. In some embodiments, the isolation layer 15 and the isolation layer 14 are formed of the same material. Alternatively, the isolation layer 15 and the isolation layer 14 are formed of different materials. In some embodiments, the first package body 14 defines a plurality of accommodation spaces to accommodate a respective conductive element 13, and a profile of each of the accommodation spaces is defined by a respective conductive element 13.

Figure 1B:
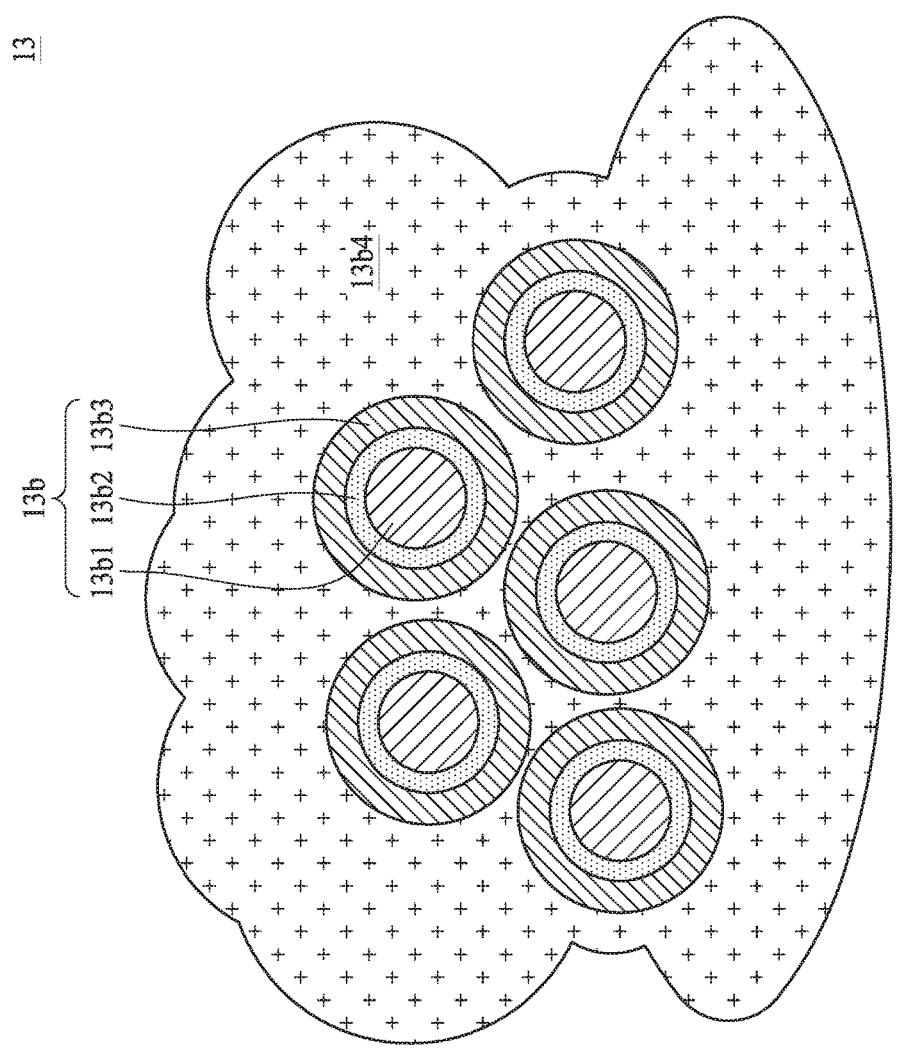
FIG. 1B illustrates an inner structure of a conductive pillar as shown in FIG. 1A in accordance with some embodiments of the present disclosure.

FIG. 1B illustrates an inner structure of the conductive pillar 13 as shown in FIG. 1A in accordance with some embodiments of the present disclosure. As shown in FIG. 1B, the conductive pillar 13 is formed by multiple conductive particles 13b and a conductive layer or matrix 13b4 covering the conductive particles 13b.

The conductive particle 13b includes a metal core 13b1, a barrier layer 13b2 and a conductive layer 13b3. The metal core 13b1 may provide a support structure for the conductive pillar 13. In some embodiments, the metal core 13b1 may include, for example, copper (Cu), silver (Ag), gold (Au), platinum (Pt) or other metal or alloys. The barrier layer 13b2 is disposed on the metal core 13b1 to surround the metal core 13b1. In some embodiments, the metal core 13b1 may include, for example, nickel (Ni), titanium (Ti), tungsten (W) or other metal or alloys. The conductive layer 13b3 is disposed on the barrier layer 13b2 to surround the barrier layer 13b2. In some embodiments, the conductive layer 13b3 is a solder layer including, for example, Cu, Ag, Au, Pt or other metal or alloy with a low melting point.

The conductive layer 13b4 surrounds the conductive layer 13b3. In some embodiments, the conductive layer 13b4 includes, for example, tin (Sn), Ag or other metal or alloy with a low melting point. In some embodiments, the melting point of the barrier layer 13b2 or the conductive layer 13b3 is greater than the melting point of the conductive layer 13b4.

In some embodiments, the barrier layer 13b2 may be omitted from the conductive particle 13b. In this case, an intermetallic compound (IMC) may be formed between the metal core 13b1 and the conductive layer 13b3 (e.g., a boundary between the metal core 13b1 and the conductive layer 13b3), which may lead to a crack or void of the conductive pillar 13. In addition, without the barrier layer 13b2, a boundary between the metal core 13b1 and the conductive layer 13b3 may be rough, which may affect the conductivity of the conductive pillar 13. As shown in FIG. 1B of the present disclosure, by placing the barrier layer 13b2 between the metal core 13b1 and the conductive layer 13b3, the IMC issues and roughness of the boundary can be overcome, which would increase the conductivity and firmness of the conductive pillar 13.

Figure 1C:
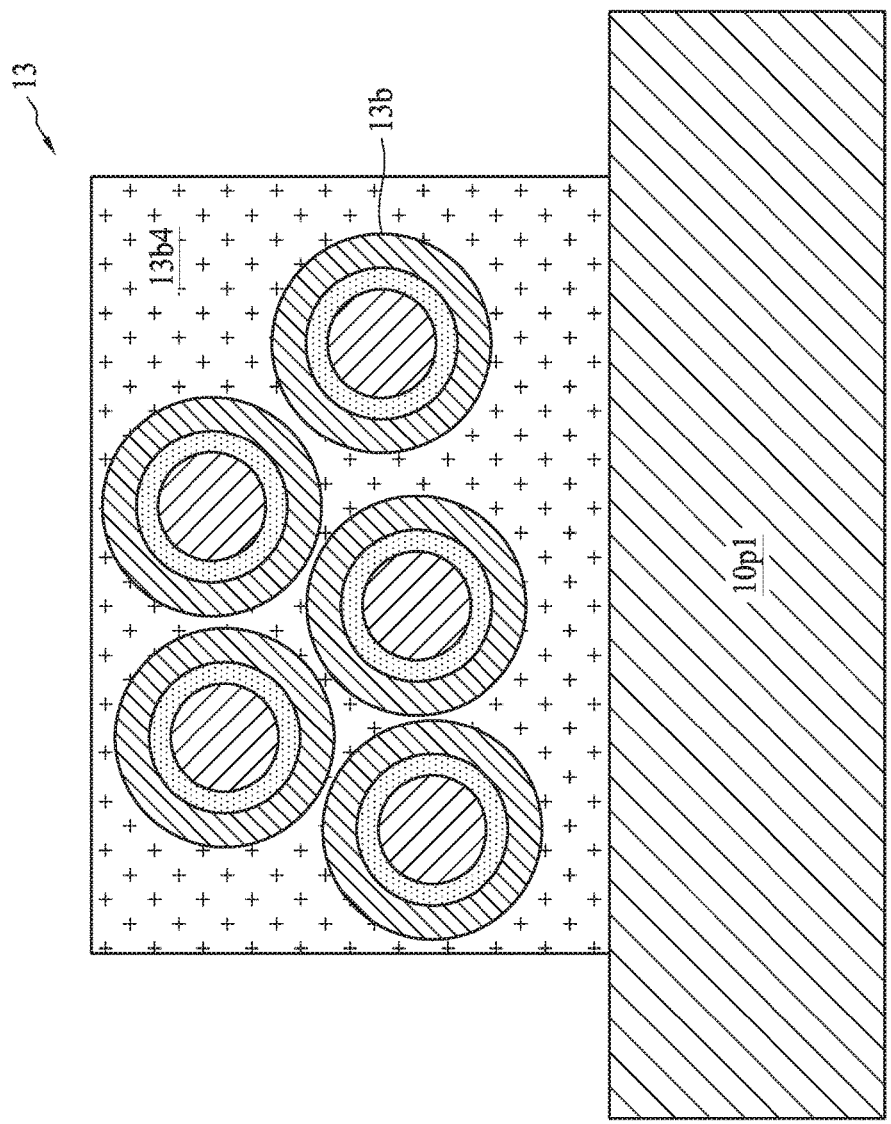
FIG. 1C illustrates an enlarged view of a portion of the semiconductor package device circled by a dashed line box A in FIG. 1A.

FIG. 1C illustrates an enlarged view of a portion of the semiconductor package device 1 that is circled by a dashed line box A in FIG. 1A. As shown in FIG. 1C, the conductive pillar 13 is disposed on the conductive pad 10p1 on the first surface 101 of the substrate 10. All conductive particles 13b are over the conductive pad 10p1 on the first surface 101 of the substrate 10.

Figure 1D:
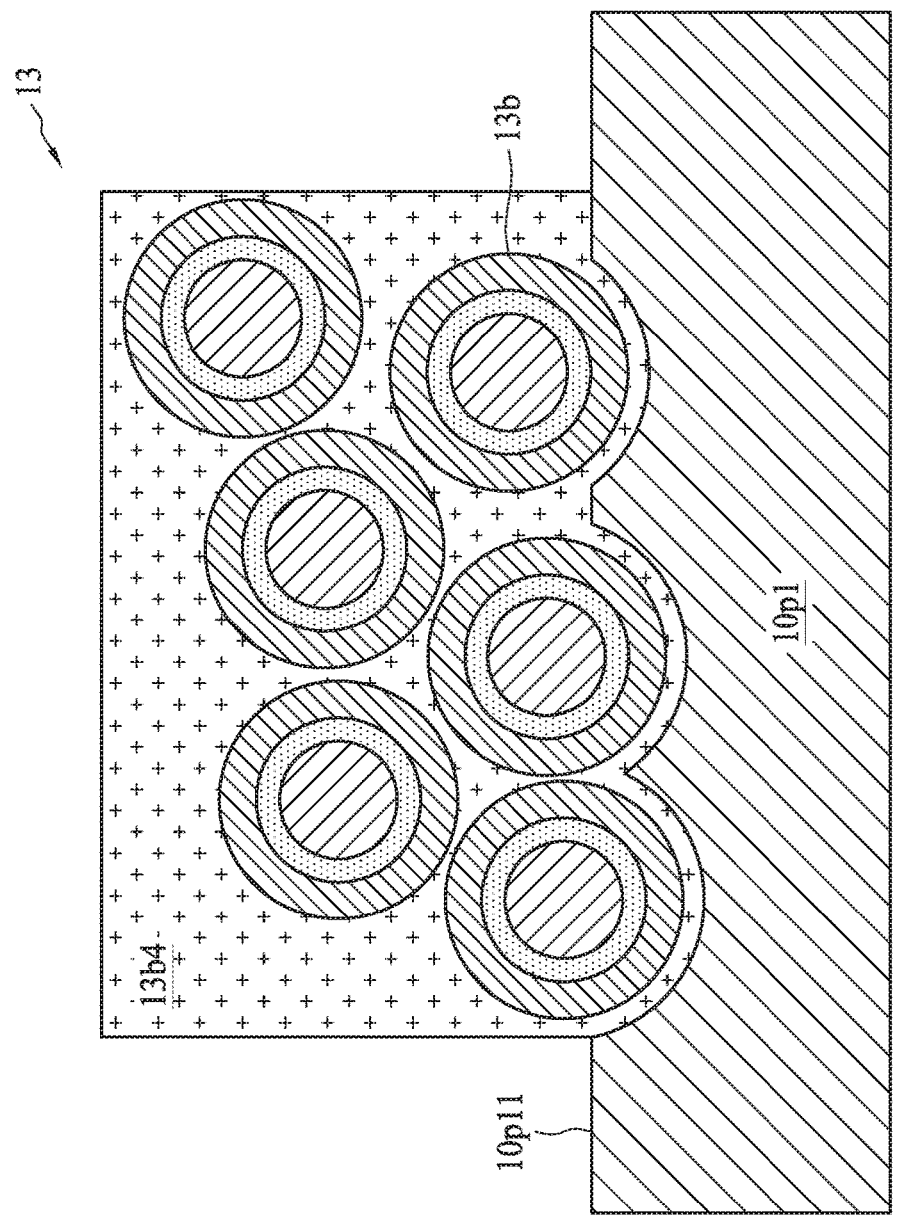
FIG. 1D illustrates an enlarged view of a portion of the semiconductor package device circled by a dashed line box A in FIG. 1A.

FIG. 1D illustrates an enlarged view of a portion of the semiconductor package device 1 that is circled by a dashed line box A in FIG. 1A. As shown in FIG. 1D, a portion of the conductive pillar 13 is disposed on the conductive pad 10p1 on the first surface 101 of the substrate 10 and another portion of the conductive pillar 13 extends into the conductive pad 10p1. For example, a portion of the conductive particles 13b extends into the conductive pad 10p1 on the first surface 101 of the substrate 10. For example, a portion of the conductive particles 13b is under a surface 10p11 of the conductive pad 10p1 on the first surface 101 of the substrate 10.

FIGS. 2A, 2B, 2C, 2D, 2E, 2F, 2G and 2H are cross-sectional views of a semiconductor structure fabricated at various stages, in accordance with some embodiments of the present disclosure. Various figures have been simplified for a better understanding of aspects of the present disclosure.

Figure 2A:
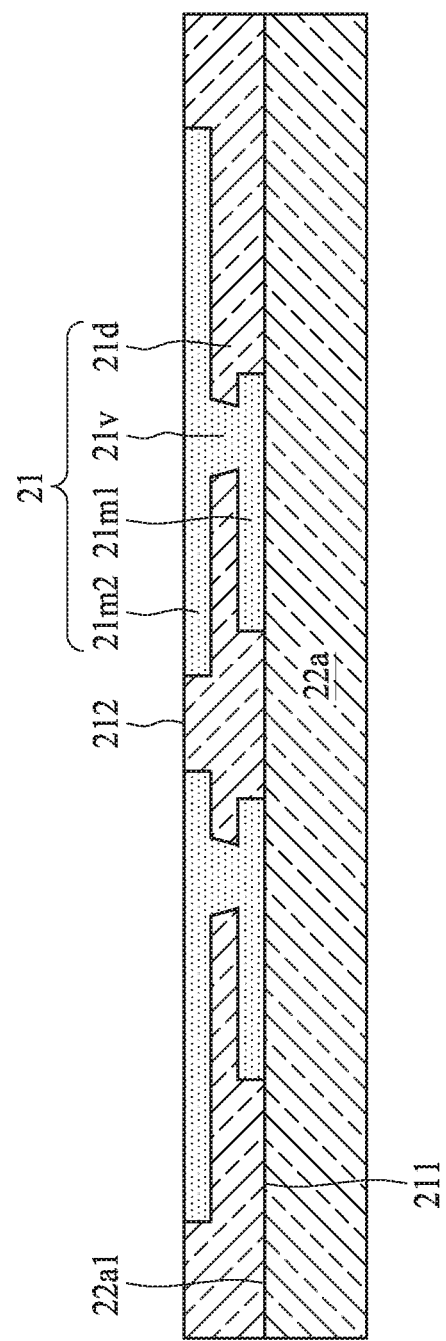
FIG. 2A, FIG. 2B, FIG. 2C, FIG. 2D, FIG. 2E, FIG. 2F, FIG. 2G and FIG. 2H are cross-sectional views of a semiconductor structure fabricated at various stages, in accordance with some embodiments of the present disclosure.

Referring to FIG. 2A, an electronic component 22a (e.g., a die or a chip) is provided. The electronic component 22a has an active surface 22a1. An RDL 21 is formed on the active surface 22a1 of the electronic component 22a. In some embodiments, the RDL 21 includes a dielectric layer 21d and conductive layers 21m1, 21m2 (or metal layers) encapsulated or covered by the dielectric layer 21d. The conductive layers 21m1, 21m2 are electrically connected through conductive interconnections 21v (e.g., vias). In some embodiments, the conductive layers 21m1, 21m2 are formed or disposed by a thermal spraying technique in which melted (or heated) materials are sprayed onto a surface. In some embodiments, the RDL 21 may include any number of dielectric layers and conductive layers according to several different embodiments. For example, the RDL 21 may include N dielectric layers and conductive layers, where N is an integer. The conductive layer 21m1 is exposed from the dielectric layer 21d to provide electrical connections on a first surface 211 of the RDL 21. The conductive layer 21m2 is exposed from the dielectric layer 21d to provide electrical connections on a second surface 212 of the RDL 21.

Figure 2B:
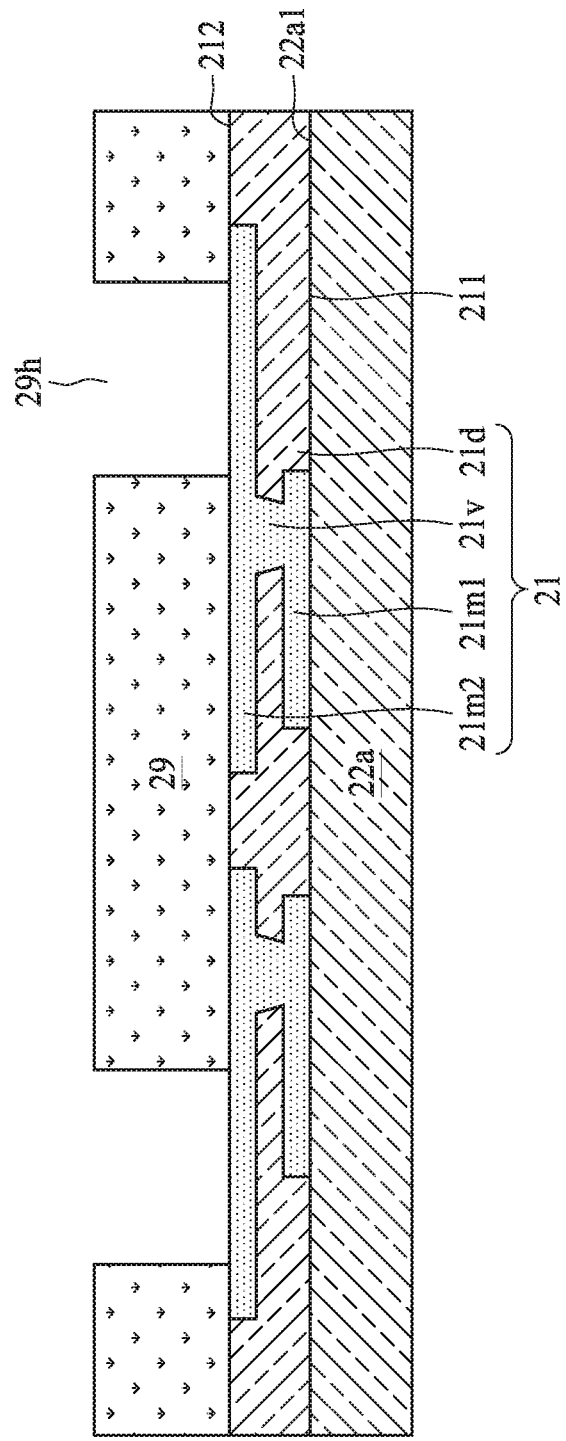

Referring to FIG. 2B, a photoresist 29 or a mask or other insulating layer is placed on the RDL 21. The photoresist 29 has or defines a plurality of openings 29h to expose at least a portion of the conductive layer 21m2 of the RDL 21. In some embodiments, the photoresist 29 may be formed by coating, lamination or other suitable processes.

Figure 2C:
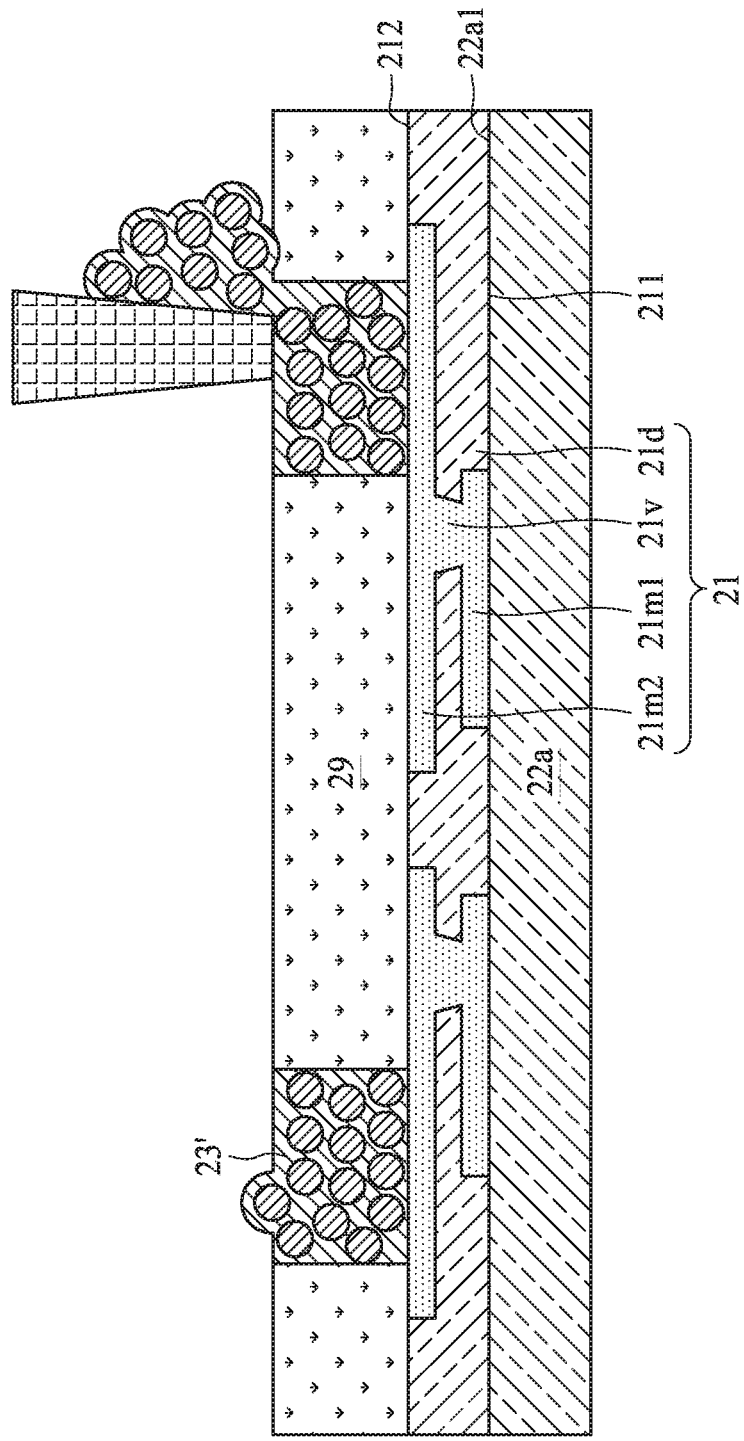

Referring to FIG. 2C, a paste 23' is filled within the openings 29h defined by the photoresist 29. In some embodiments, the paste 23' can be filled within the openings 29h by scraping, printing or other suitable processes. In some embodiments, before filling the paste 23' into the openings 29h, a screen may be placed on the photoresist 29. The screen has a plurality of openings corresponding to the openings 29h of the photoresist 29. In this way, the printing process can be carried out on the screen (rather than on the photoresist 29) to prevent the solvent of the paste 23' from remaining on the photoresist 29.

Figure 2D:
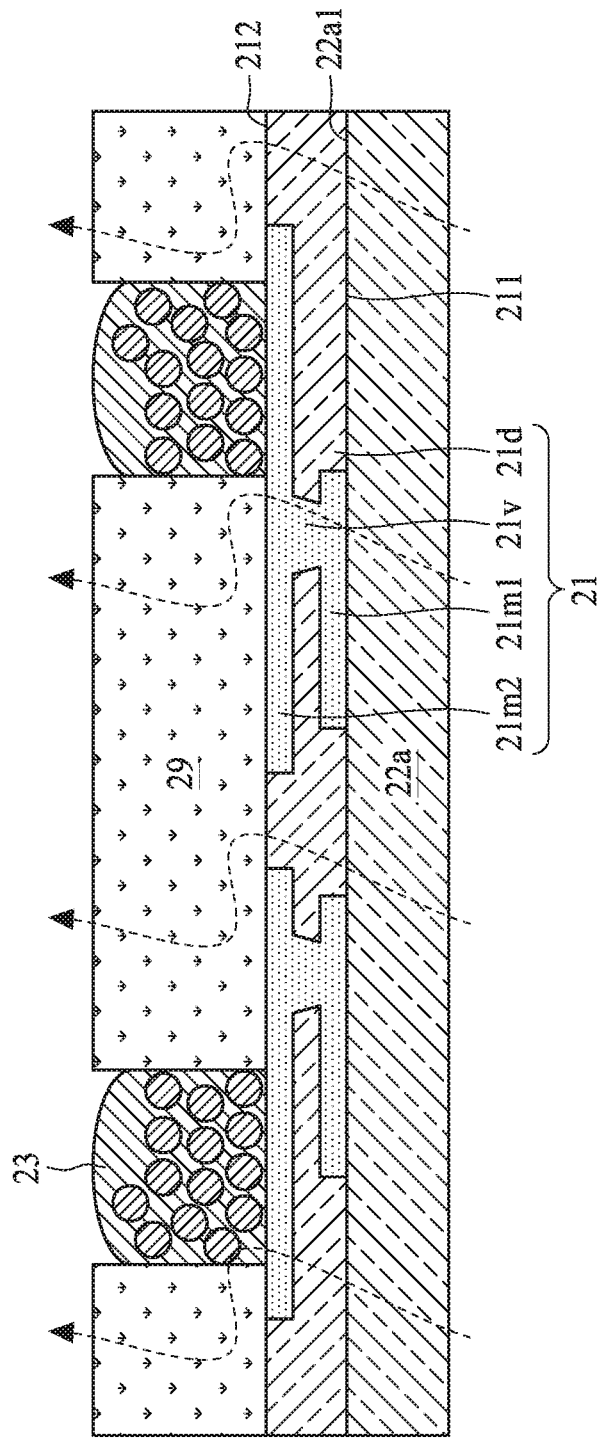

Referring to FIG. 2D, after the paste 23' is filled within the openings 29h, a reflow process is carried out to form a conductive pillar 23. After the reflow process, the solvent may evaporate, and parts of the flux may remain. In some embodiments, the remaining flux may be removed after the reflow process. In some embodiments, the composition of the conductive pillar 23 is similar to that of the conductive pillar 13 as shown in FIG. 1B. A conductive layer 23b4 of each conductive particle 23b is melted and combined together to cover the remaining part of the conductive particle 23b including a metal core 23b1, a barrier layer 23b2 and a first conductive layer 23b3 (see FIG. 3A and FIG. 3B).

Figure 2E:
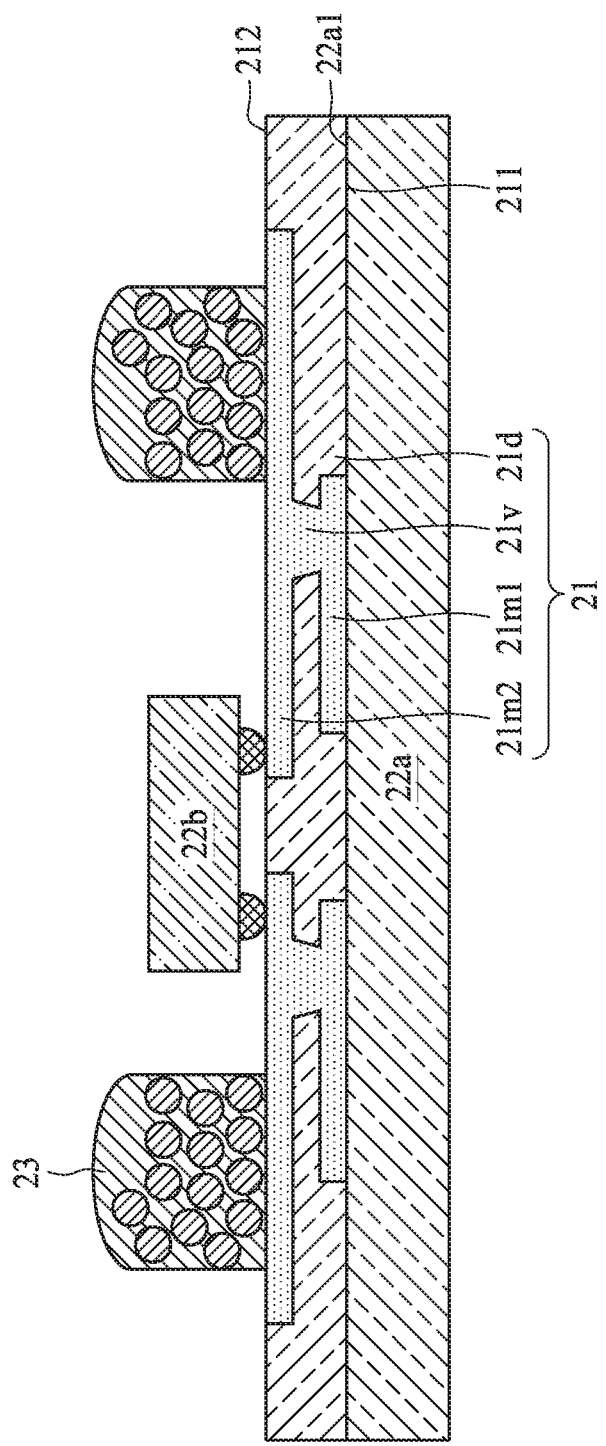

Referring to FIG. 2E, the photoresist 29 is removed and an electronic component 22b is placed on the second surface 212 of the RDL 21. The electronic component 22b may be electrically connected to the RDL 21 by a flip-chip or wire bonding technique.

Figure 2F:
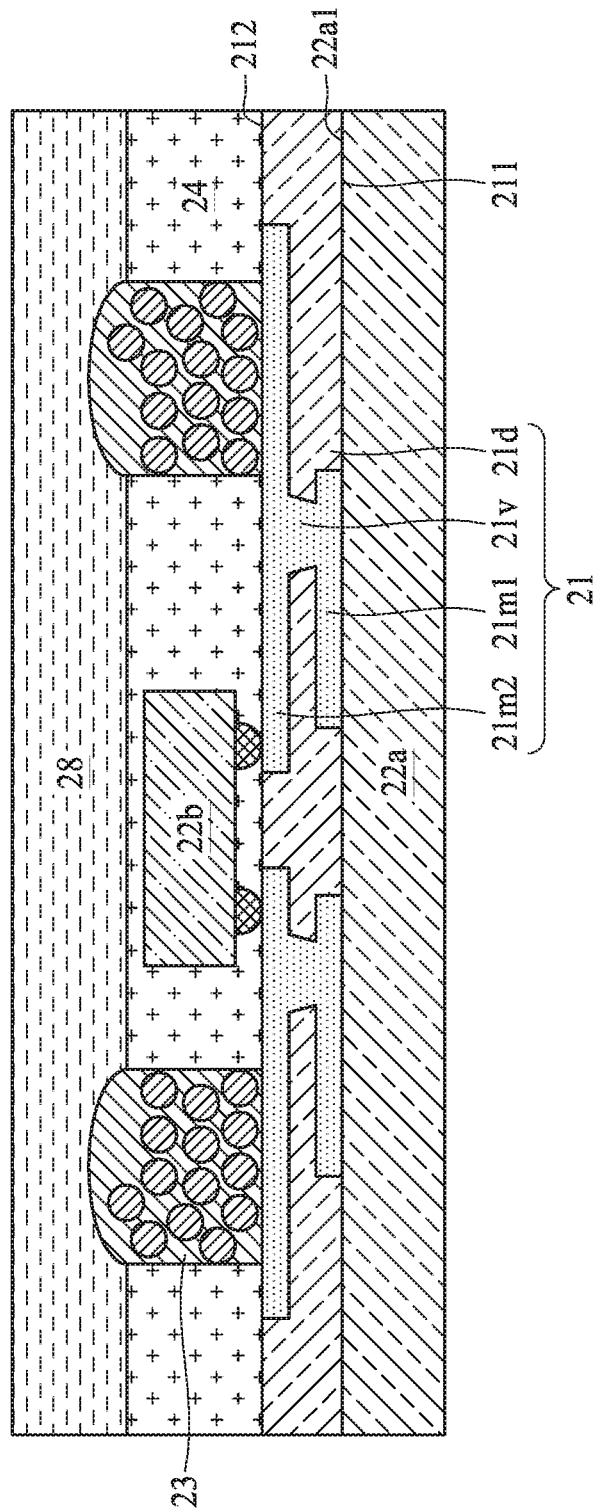

Referring to FIG. 2F, a dry-film 28 is placed or disposed on the conductive pillar 23 to cover a portion of the conductive pillar 23. An isolation layer 24 is formed or disposed on the second surface 212 of the RDL 21 to cover a portion of the second surface 212 of the RDL 21, the electronic component 22b and a portion of the conductive pillar 23 that is not covered by the dry-film 28. In some embodiments, the isolation layer 24 includes, for example, organic materials (e.g., molding compound, BT, PI, PBO, solder resist, ABF, PP or epoxy-based material), inorganic materials (e.g., silicon, glass, ceramic or quartz), liquid and/or dry-film materials or a combination thereof. The isolation layer 24 may be formed by a molding technique, such as transfer molding or compression molding.

Figure 2G:
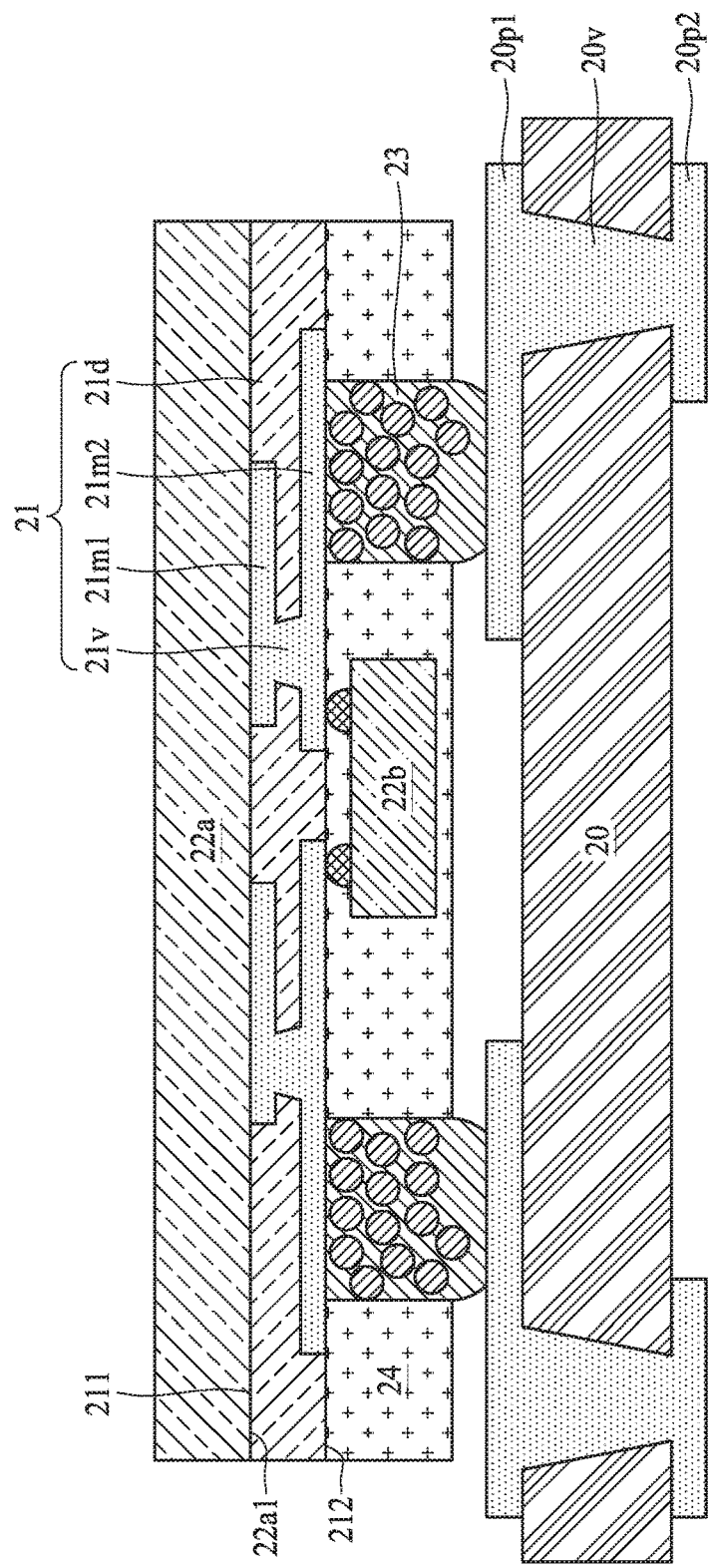

Referring to FIG. 2G, the dry-film 28 is removed from the conductive pillar 23 to expose a portion of the conductive pillar 23. The conductive pillar 23 is then placed on a substrate 20. The exposed portion of the conductive pillar 23 is electrically connected with a conductive pad 20p1 of the substrate 20.

Figure 2H:
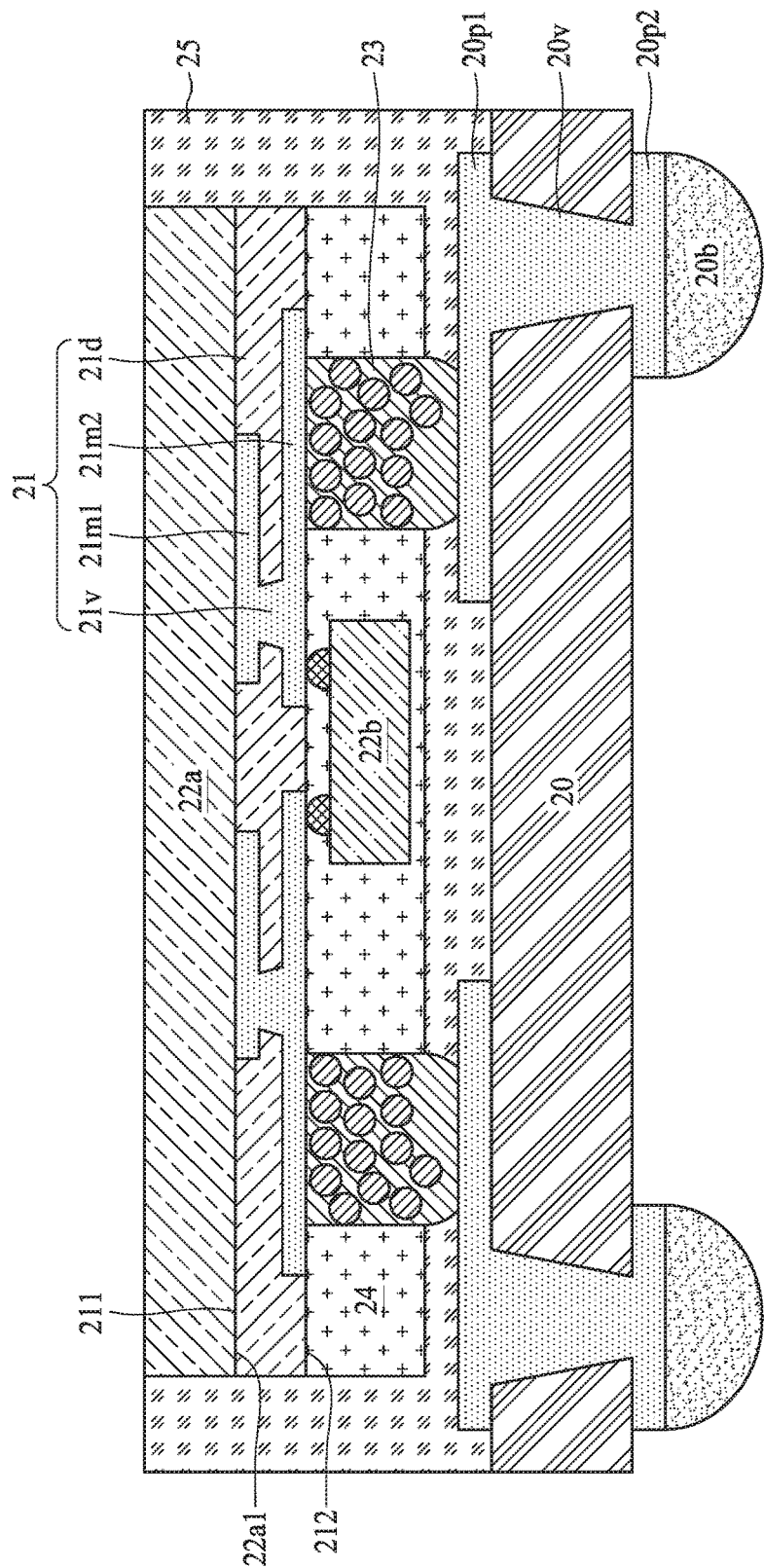

Referring to FIG. 2H, an isolation layer 25 is formed or disposed on the substrate 20 to cover substantially coplanar lateral surfaces defined by the electronic component 22a, the RDL 21 and the isolation layer 24 and the exposed portion of the conductive pillar 23. In some embodiments, the isolation layer 25 includes, for example, organic materials (e.g., molding compound, BT, PI, PBO, solder resist, ABF, PP or epoxy-based material), inorganic materials (e.g., silicon, glass, ceramic or quartz), liquid and/or dry-film materials or a combination thereof. In some embodiments, the isolation layer 25 and the isolation layer 24 are formed of the same material. Alternatively, the isolation layer 25 and the isolation layer 24 are formed of different materials. An electrical contact 20b (e.g., C4 pad) is formed or disposed on a conductive pad 20p2 to provide electrical connections between the substrate 20 and external devices. In some embodiments, the method illustrated in FIGS. 2A-2H may be referred to as a "chip-last" process.

FIG. 3A illustrates a composition of the paste 23' shown in FIG. 2B in accordance with some embodiments of the present disclosure. As shown in FIG. 3A, the paste 23' includes multiple conductive particles 23b and a mixture 23a including a solvent and flux. The mixture 23a covers or encapsulates the conductive particles 23b. In some embodiments, the mixture 23a does not include solder.

Figure 3B:
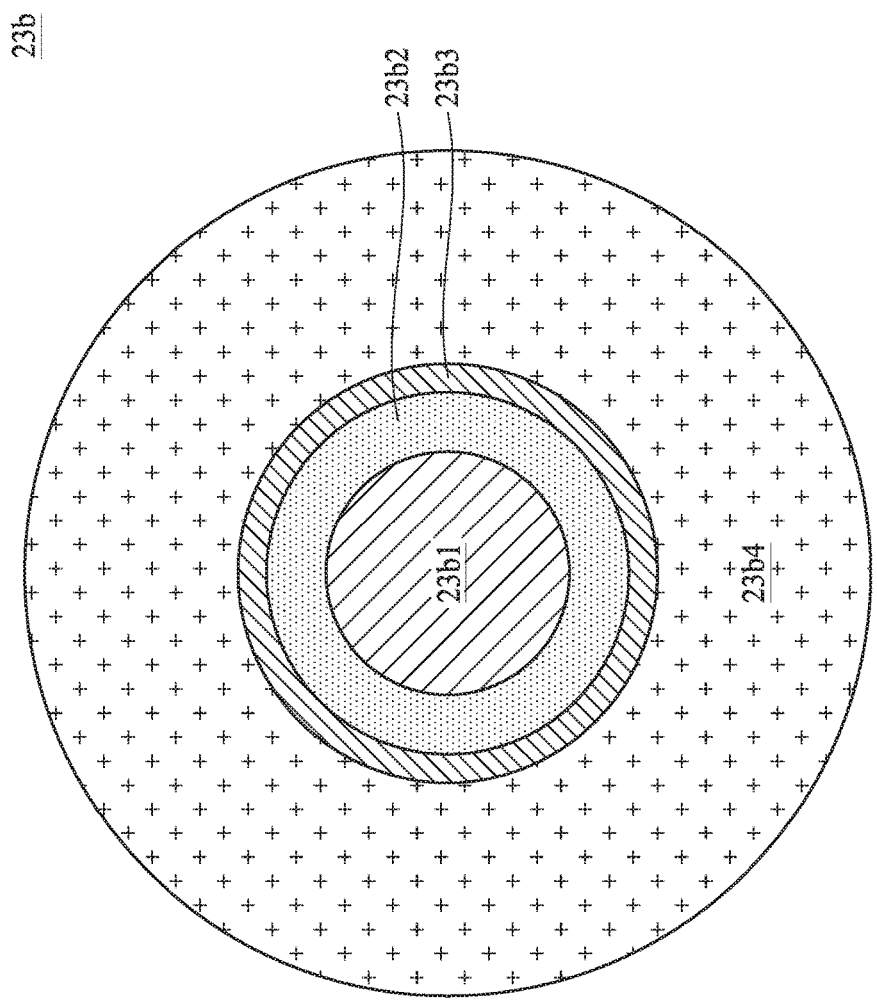
FIG. 3B illustrates an enlarged view of a conductive particle as shown in FIG. 3A in accordance with some embodiments of the present disclosure.

FIG. 3B illustrates an enlarged view of the conductive particle 23b as shown in FIG. 3A in accordance with some embodiments of the present disclosure. The conductive particle 23*b* includes a metal core 23*b*1, a barrier layer 23*b*2, a first conductive layer 23*b*3 and a second conductive layer 23*b*4.

Figure 3C:
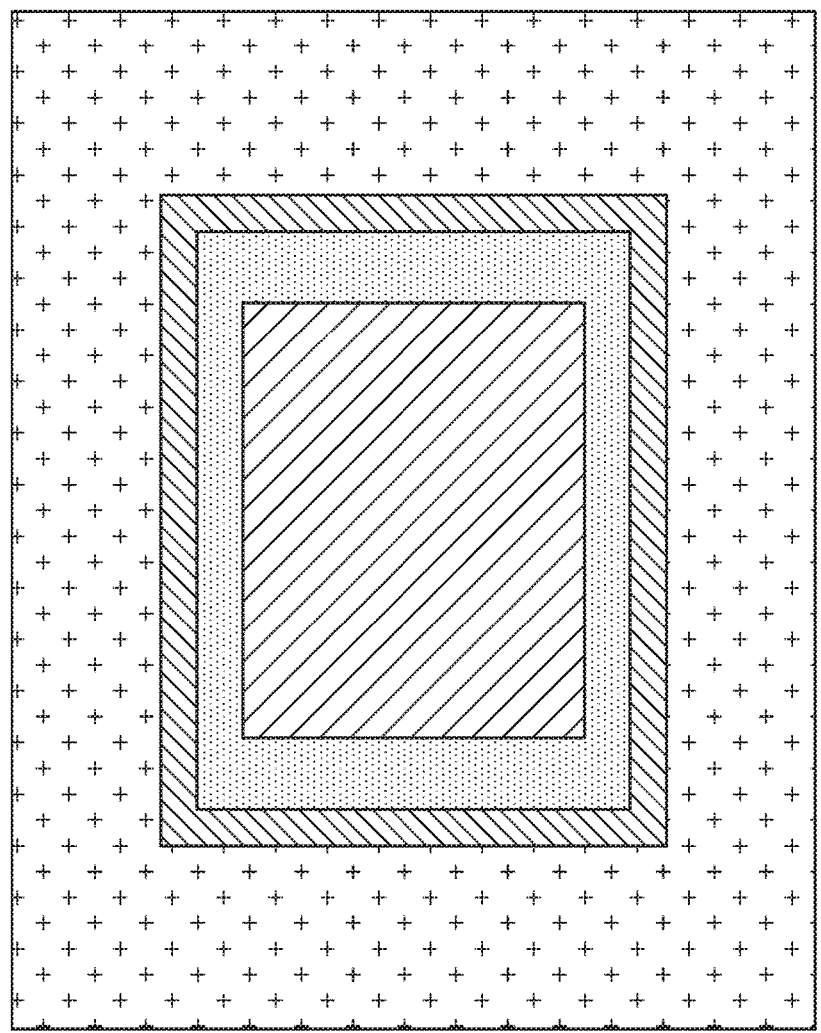
FIG. 3C illustrates an enlarged view of a conductive particle as shown in FIG. 3A in accordance with some embodiments of the present disclosure.
Figure 3D:
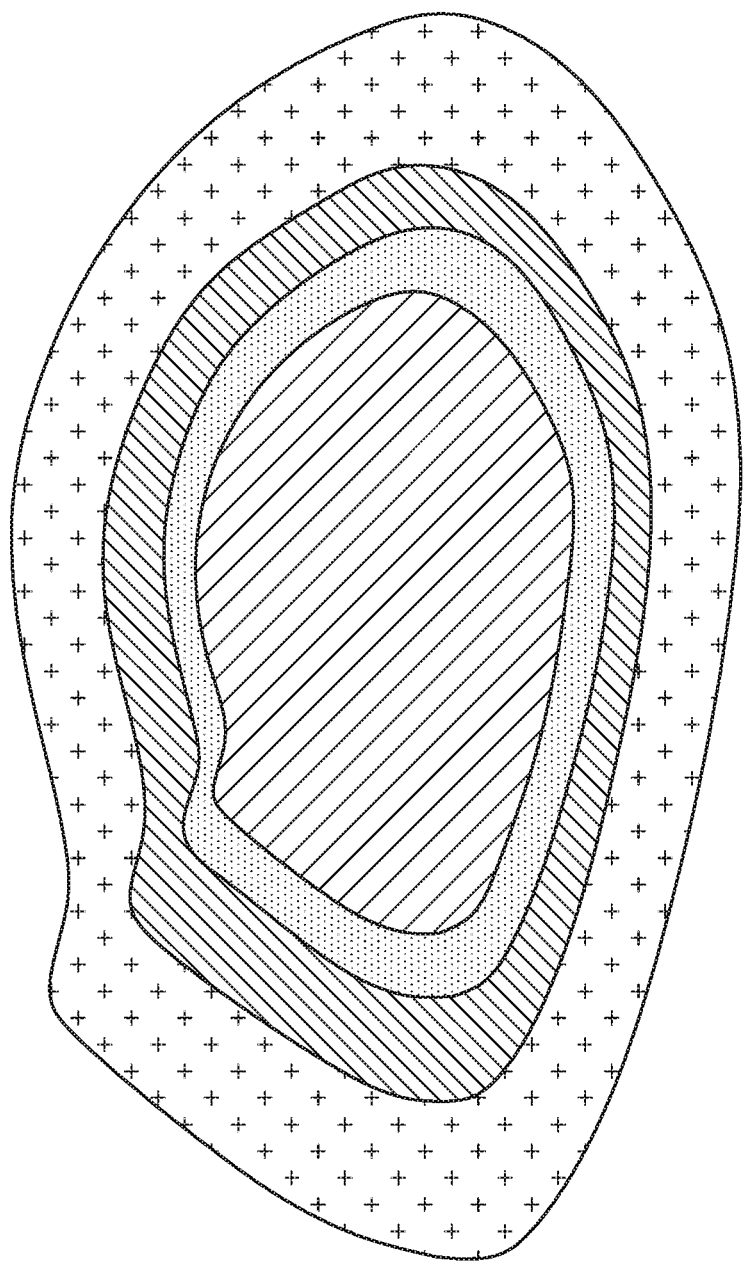
FIG. 3D illustrates an enlarged view of a conductive particle as shown in FIG. 3A in accordance with some embodiments of the present disclosure.

In some embodiments, the metal core 23*b*1 may include, for example, Cu, Ag, Au, Pt or other metal or alloys. The barrier layer 23*b*2 is disposed on the metal core 23*b*1 to surround the metal core 23*b*1. In some embodiments, the barrier layer 23*b*2 may include, for example, Ni, Ti, W or other metal or alloys. The first conductive layer 23*b*3 (e.g., underlayer) is disposed on the barrier layer 23*b*2 to surround the barrier layer 23*b*2. In some embodiments, the first conductive layer 23*b*3 is a solder layer including, for example, Cu, Ag, Au, Pt or other metal or alloy with a low melting point. The second conductive layer 23*b*4 is disposed on the first conductive layer 23*b*3 to surround the first conductive layer 23*b*3. In some embodiments, the second conductive layer 23*b*4 includes, for example, Sn, Ag or other metal or alloy with a low melting point. In some embodiments, the melting point of the barrier layer 23*b*2 or the first conductive layer 23*b*3 is greater than the melting point of the second conductive layer 23*b*4. In some embodiments, the conductive particle 23*b* is a sphere, a cube (e.g., a conductive particle 23*b*' shown in FIG. 3C) or irregular-shaped (e.g., a conductive particle 23*b*" shown in FIG. 3D).

As mentioned above, the barrier layer 23*b*2 can avoid the formation of IMC at the boundary of the metal core 23*b*1 and the first conductive layer 23*b*3. In some embodiments, the second conductive layer 23*b*4 (e.g., solder layer) may be directly formed or disposed on the barrier layer 23*b*2 by electroplating. However, due to electrical potential difference between the barrier layer 23*b*2 and solder layer, the barrier layer 23*b*2 and the solder layer may not be directly attached to each other. Therefore, using an electroplating technique to form the solder layer on the barrier layer 23*b*2 may increase manufacturing cost. In accordance with some embodiments, a thin metal layer (e.g., the first conductive layer 23*b*3) is sputtered on the barrier layer 23*b*2 to facilitate the formation of the solder layer (e.g., the second conductive layer 23*b*4), and no electroplating process is used, which may reduce manufacturing cost and time. In some embodiments, the thin metal layer (e.g., the first conductive layer 23*b*3) may be formed by the electroplating technique; however, the time of forming the thin metal layer is much less than the time of forming the relatively thick solder layer in an interconnection structure without the thin metal layer.

Figure 4A:
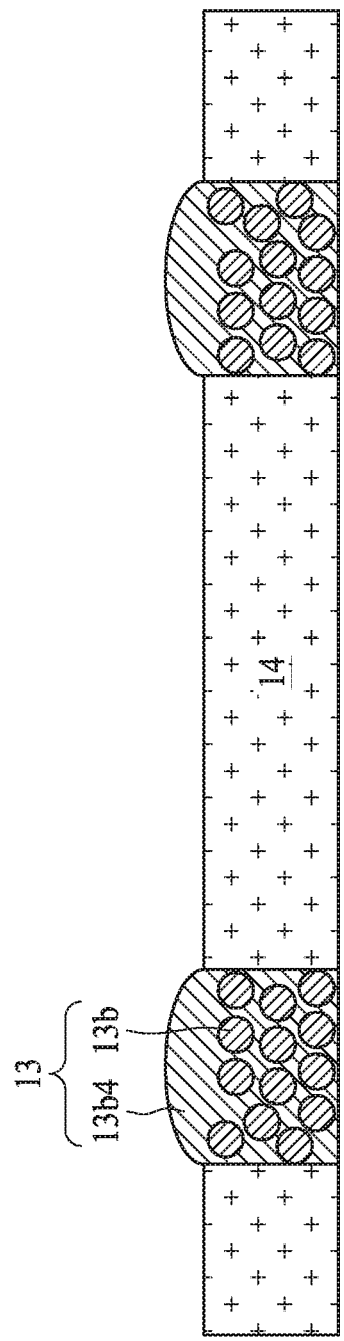
Figure 4C:
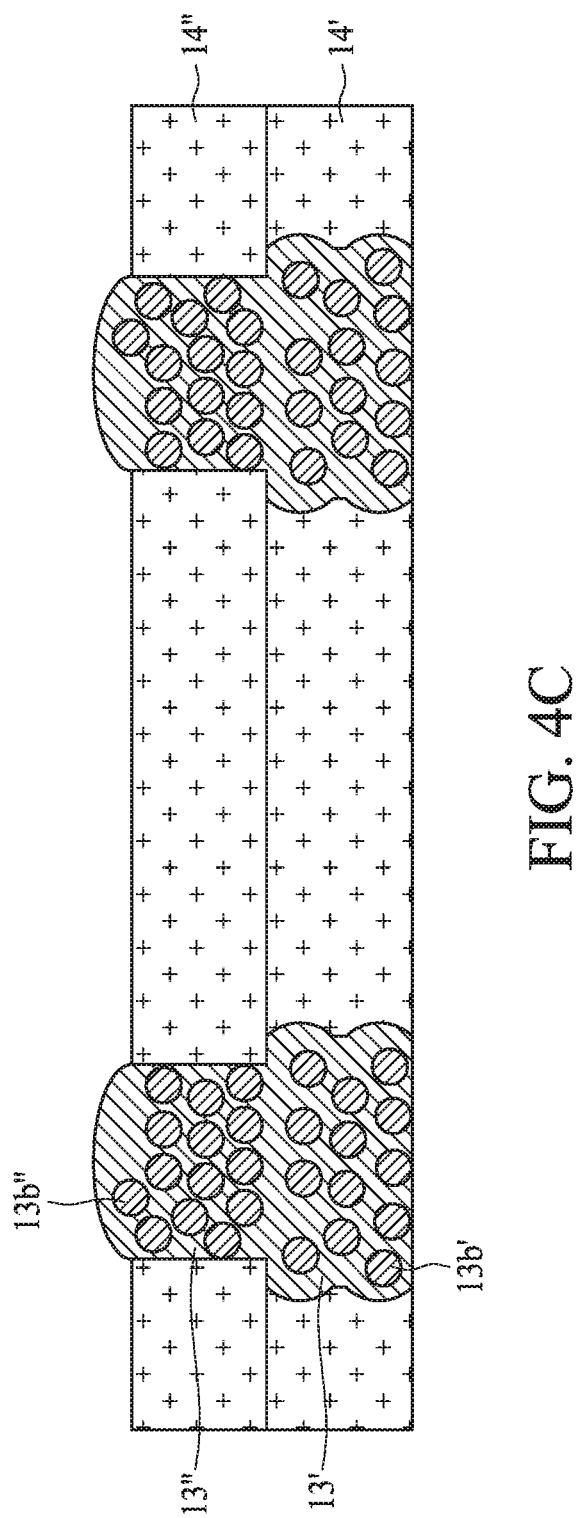

FIGS. 4A, 4B and 4C illustrate different types of conductive pillars in accordance with some embodiments of the present disclosure. The conductive pillars shown in FIGS. 4A, 4B and 4C may be applicable to the semiconductor package device 1 shown in FIG. 1A.

As shown in FIG. 4A, all conductive particles 13*b* are encapsulated or covered by the conductive layer 13*b*4 (e.g., solder layer). As shown in FIG. 4B, a portion of conductive particles 13*b* is exposed from the conductive layer 13*b*4 (e.g., solder layer). As shown in FIG. 4C, the conductive pillar includes a plurality of conductive pillars 13', 13" stacked in a vertical direction, and the isolation layer includes a plurality of isolation layers 14', 14" stacked in a vertical direction. In some embodiments, the conductive particles 13*b*' of the conductive pillar 13' are larger than (or otherwise have a different average size than) the conductive particles 13*b*" of the conductive pillar 13".

Figure 5:
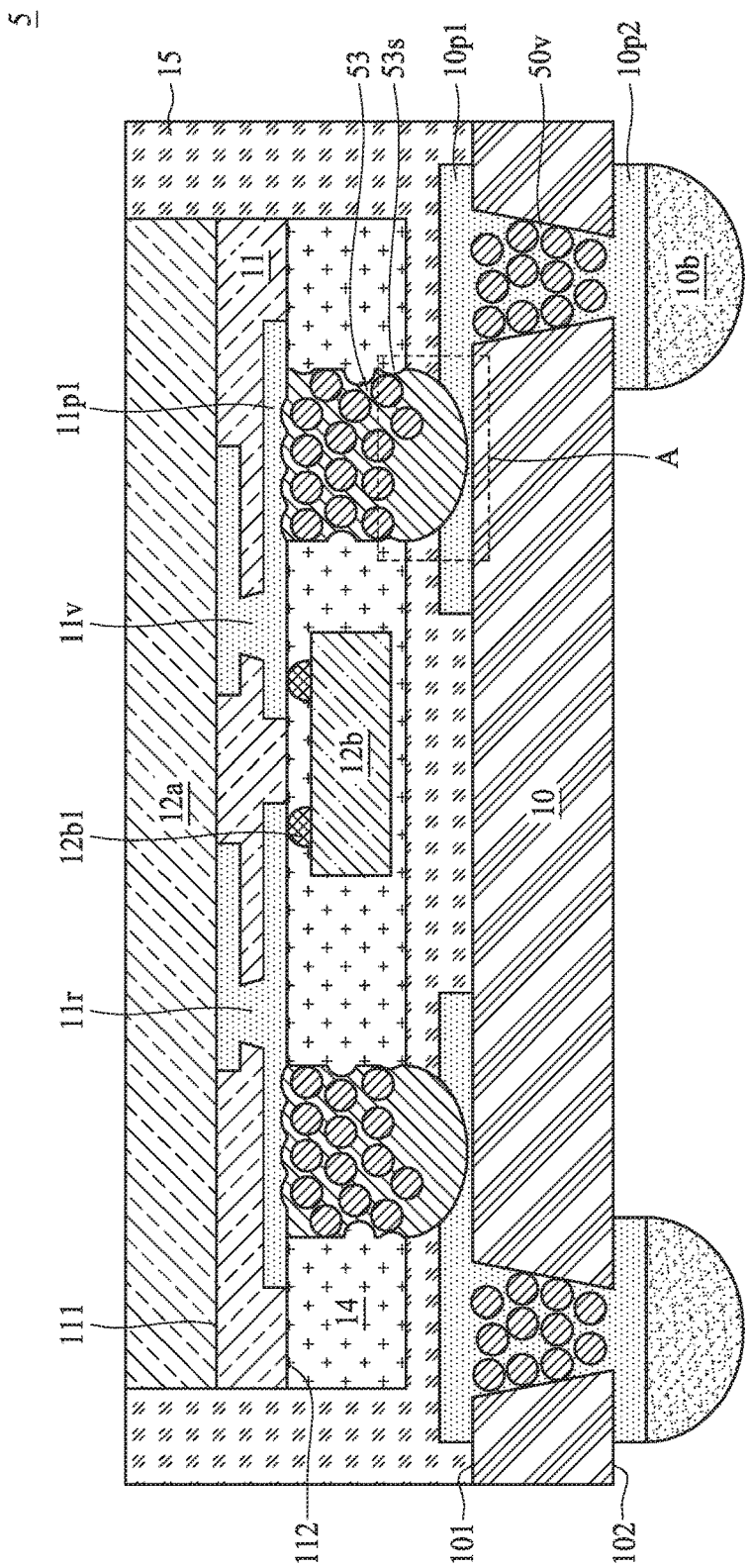
FIG. 5 illustrates a cross-sectional view of a semiconductor package device in accordance with some embodiments of the present disclosure.

FIG. 5 illustrates a cross-sectional view of a semiconductor package device 5 in accordance with some embodiments of the present disclosure. The semiconductor package device 5 is similar to the semiconductor package device 1 shown in FIG. 1 except that the conductive via 50*v* of the semiconductor package device 5 includes the same or similar structure as the conductive pillar 13. For example, the conductive via 50*v* includes multiple conductive particles and a conductive layer as shown in FIG. 1B. In addition, a sidewall of conductive pillar (or conductive element) 53 is not planar. In some embodiments, after a reflow process, the solder layer (e.g., the conductive layer 13*b*4 shown in FIG. 1B) of each of the conductive particles of the conductive pillar 53 may be connected together. Due to the surface tension of the solder, the sidewall of the conductive pillar 53 is not flat. As shown in FIG. 5, the sidewall of the conductive pillar 53 includes many recesses (or depressions) 53*s*. When the molding compound (e.g., the isolation layer 14) is formed or disposed to cover the conductive pillar 53, the recesses 53*s* would be filled by the molding compound, so as to increase the binding strength between the conductive pillar 53 and the molding compound, which may prevent the conductive pillar 53 from being delaminated from the conductive pad 10*p*1.

Figure 6:
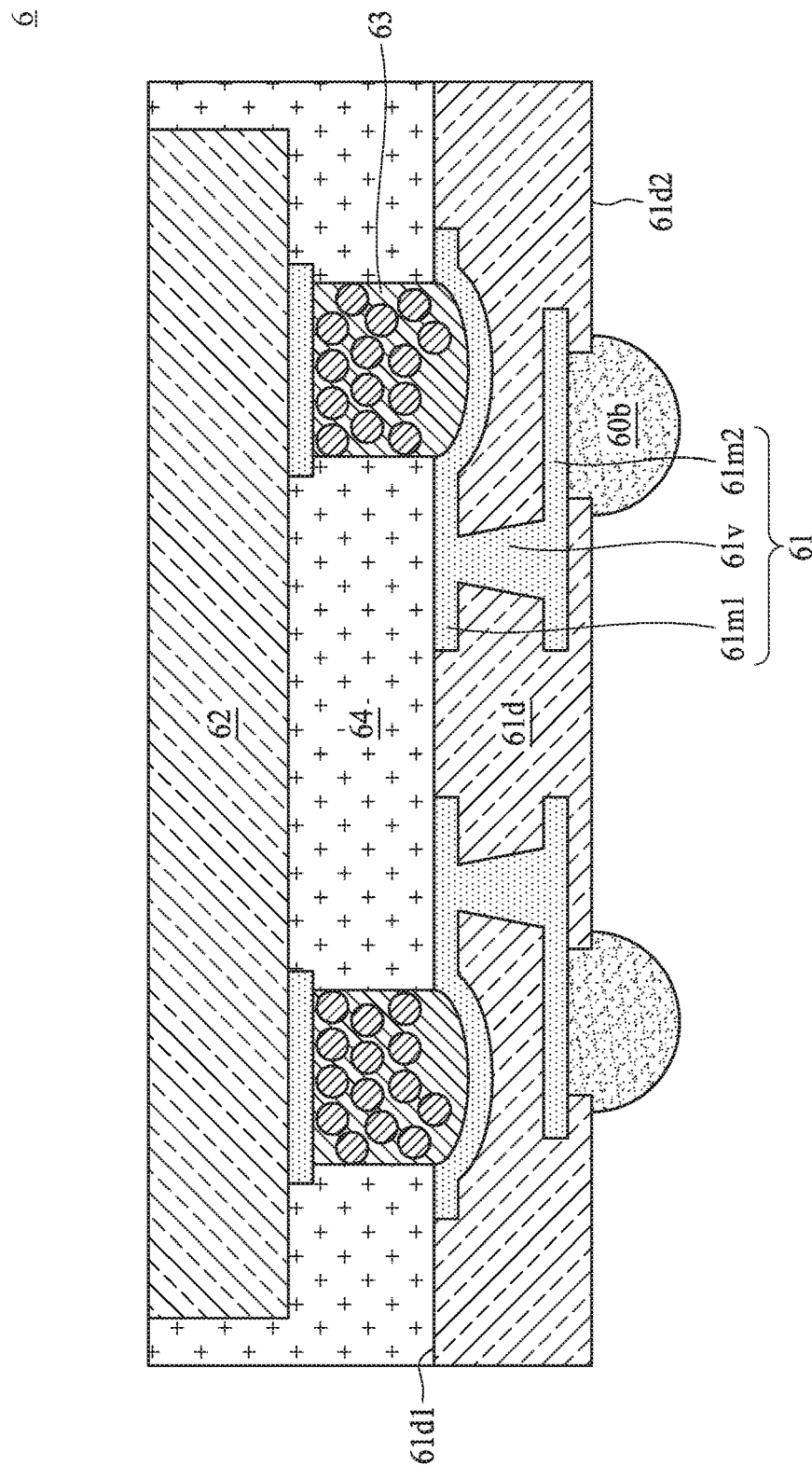
FIG. 6 illustrates a cross-sectional view of a semiconductor package device in accordance with some embodiments of the present disclosure.

FIG. 6 illustrates a cross-sectional view of a semiconductor package device 6 in accordance with some embodiments of the present disclosure. The semiconductor package device 6 includes an RDL 61, an electronic component 62, a conductive pillar 63 and an isolation layer 64.

In some embodiments, the RDL 61 includes a dielectric layer 61*d* and conductive layers 61*m*1, 61*m*2 (or metal layers) encapsulated or covered by the dielectric layer 61*d*. The conductive layers 61*m*1, 61*m*2 are electrically connected through conductive interconnections 61*v* (e.g., vias). In some embodiments, the RDL 61 may include any number of dielectric layers and conductive layers according to several different embodiments. For example, the RDL 61 may include N dielectric layers and conductive layers, where N is an integer. The conductive layer 61*m*1 is exposed from the dielectric layer 61*d* to provide electrical connections on a first surface 61*d*1 (also referred to as a top surface) of the RDL 61. In some embodiments, the conductive layer 61*m*1 is not planar. For example, the conductive layer 61*m*1 may include a recess. The conductive layer 61*m*2 is exposed from the dielectric layer 61*d* to provide electrical connections on a second surface 61*d*2 (also referred to as a bottom surface) of the RDL 61. An electrical contact 60*b* (e.g., solder ball) is electrically connected to the exposed portion of the conductive layer 61*m*2.

The conductive pillar 63 is disposed within the recess of the conductive layer 61*m*1 and electrically connected to the conductive layer 61*m*1. In some embodiments, the conductive pillar 63 may be a sphere pillar or a cube pillar depending on different embodiments. In some embodiments, the conductive pillar 63 is the same as or similar to the conductive pillar 13, the conductive pillar 53 or any other suitable conductive pillar.

The electronic component 62 is disposed on the conductive pillar 63. The electronic component 62 is electrically connected to the RDL 61 through the conductive pillar 63. The electronic component 62 may be a die or a chip including a semiconductor substrate, one or more integrated circuit devices and one or more overlying interconnection structures therein. The integrated circuit devices may include active devices, such as transistors, and/or passive devices, such resistors, capacitors, inductors, or a combination thereof.

The isolation layer 64 is disposed on the first surface 61*d*1 of the RDL 61 and covers a portion of the first surface 61*d*1 of the RDL 61, the conductive pillar 63 and an active surface and lateral surfaces of the electronic component 62. In some embodiments, the isolation layer 64 includes, for example, organic materials (e.g., molding compound, BT, PI, PBO, solder resist, ABF, PP or epoxy-based material), inorganic materials (e.g., silicon, glass, ceramic or quartz), liquid and/or dry-film materials or a combination thereof.

FIGS. 7A, 7B, 7C, 7D, 7E and 7F are cross-sectional views of a semiconductor structure fabricated at various stages, in accordance with some embodiments of the present disclosure. Various figures have been simplified for a better understanding of the aspects of the present disclosure.

Figure 7A:
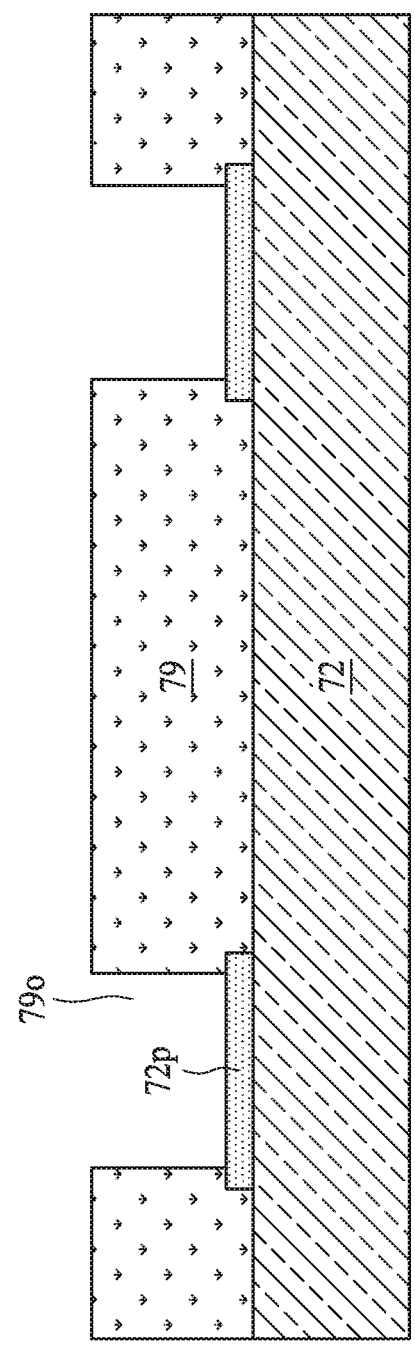
FIG. 7A, FIG. 7B, FIG. 7C, FIG. 7D and FIG. 7E are cross-sectional views of a semiconductor structure fabricated at various stages, in accordance with some embodiments of the present disclosure.

Referring to FIG. 7A, an electronic component 72 (e.g., a die or a chip) is provided. A photoresist 79 is formed or disposed on an active surface of the electronic component 72. The photoresist 79 includes a plurality of openings 790 to expose a conductive pad 72p of the electronic component 72. In some embodiments, the photoresist 79 may be formed by coating, lamination or other suitable processes.

Figure 7B:
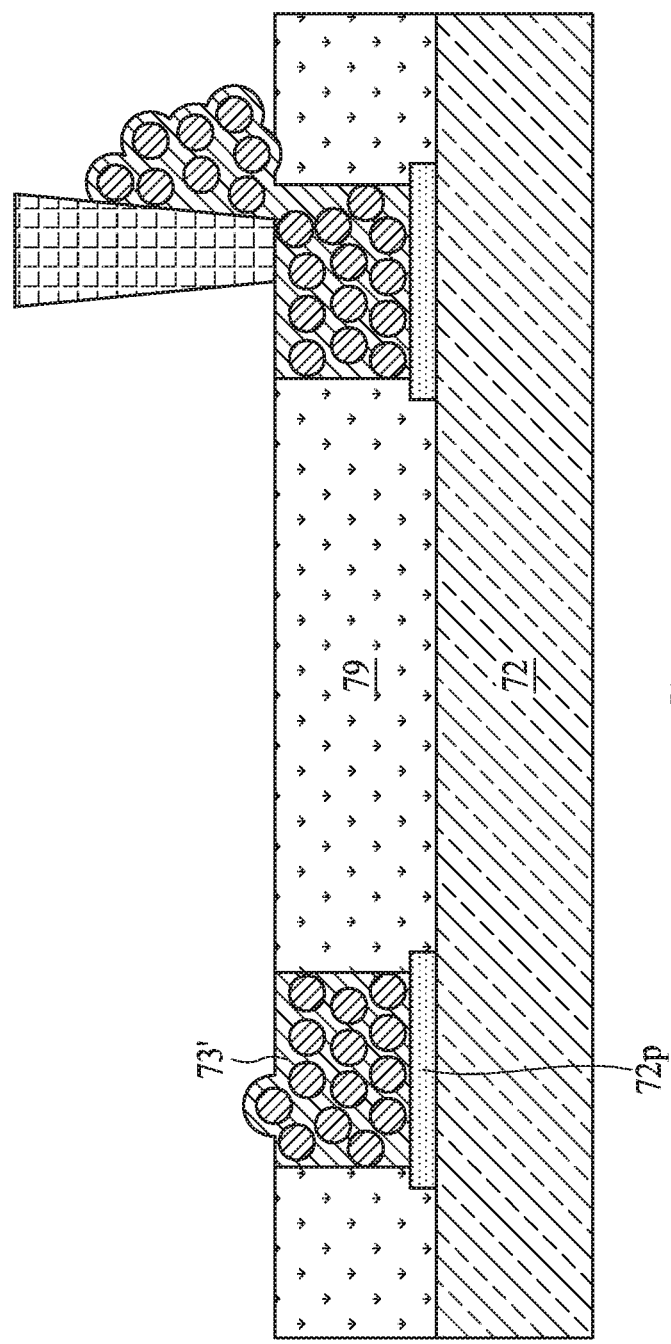

Referring to FIG. 7B, a paste 73' is filled within the openings 790 defined by the photoresist 79. In some embodiments, the paste 73' can be filled within the openings 790 by scraping, printing or other suitable process. In some embodiments, before filling the paste 73' into the openings 79o, a screen may be placed on the photoresist 79. The screen has a plurality of openings corresponding to the openings 790 of the photoresist. In this way, the printing process can be carried out on the screen (rather than on the photoresist 79) to prevent the solvent of the paste 73' from remaining on the photoresist 79. In some embodiments, the paste 73' is the same as or similar to the paste 23' as shown in FIG. 2C.

Figure 7C:
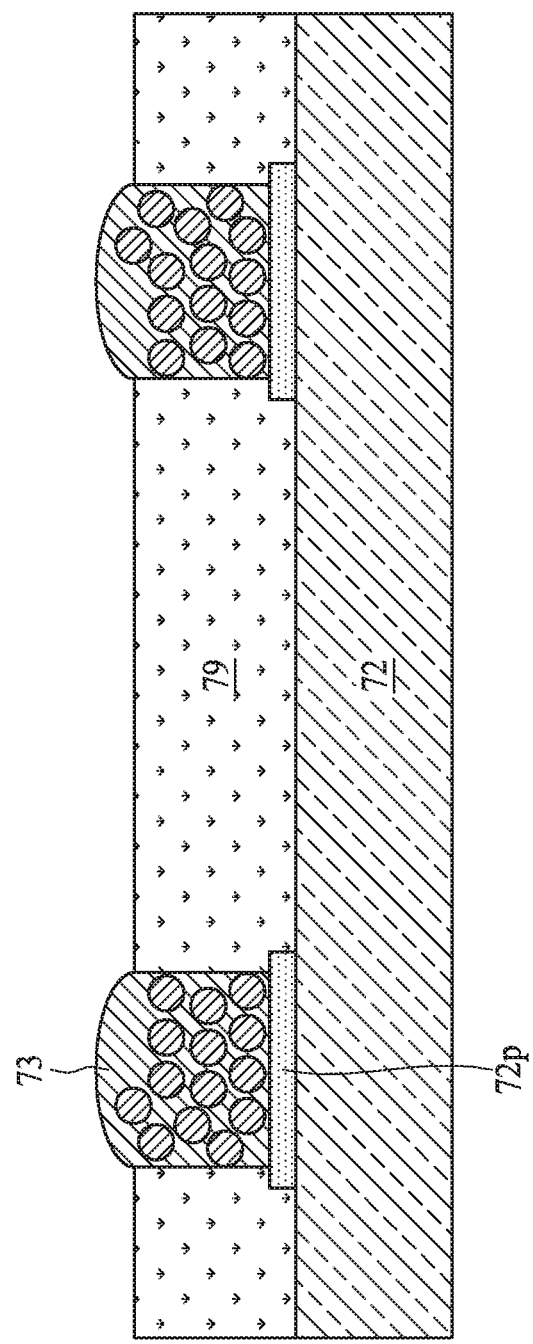

Referring to FIG. 7C, a reflow process is carried out to form a conductive pillar 73. In some embodiments, the conductive pillar 73 may protrude from the top surface of the photoresist 79. After the reflow process, the solvent may evaporate, and parts of the flux may remain. In some embodiments, the remaining flux may be removed after the reflow process. In some embodiments, the composition of the conductive pillar 73 is similar to that of the conductive pillar 13 as shown in FIG. 1B.

Figure 7D:
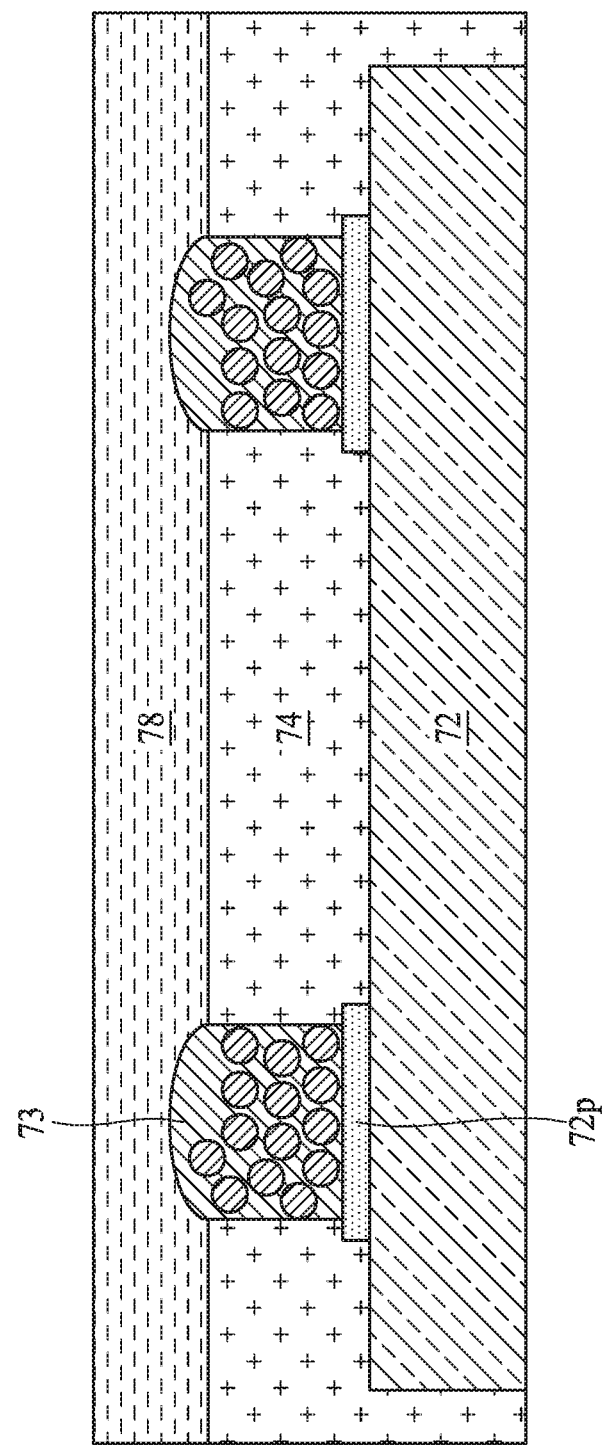

Referring to FIG. 7D, the photoresist 79 is removed and a dry-film 78 is placed on the conductive pillar 73 to cover a portion of the conductive pillar 73. An isolation layer 74 is formed or disposed on an active surface of the electronic component 72 to cover the active surface and lateral surfaces of the electronic component 72 and a portion of the conductive pillar 73 that is not covered by the dry-film 78. In some embodiments, the isolation layer 74 includes, for example, organic materials (e.g., molding compound, BT, PI, PBO, solder resist, ABF, PP or epoxy-based material), inorganic materials (e.g., silicon, glass, ceramic or quartz), liquid and/or dry-film materials or a combination thereof. The isolation layer 74 may be formed or disposed by a molding technique, such as transfer molding or compression molding.

Figure 7E:
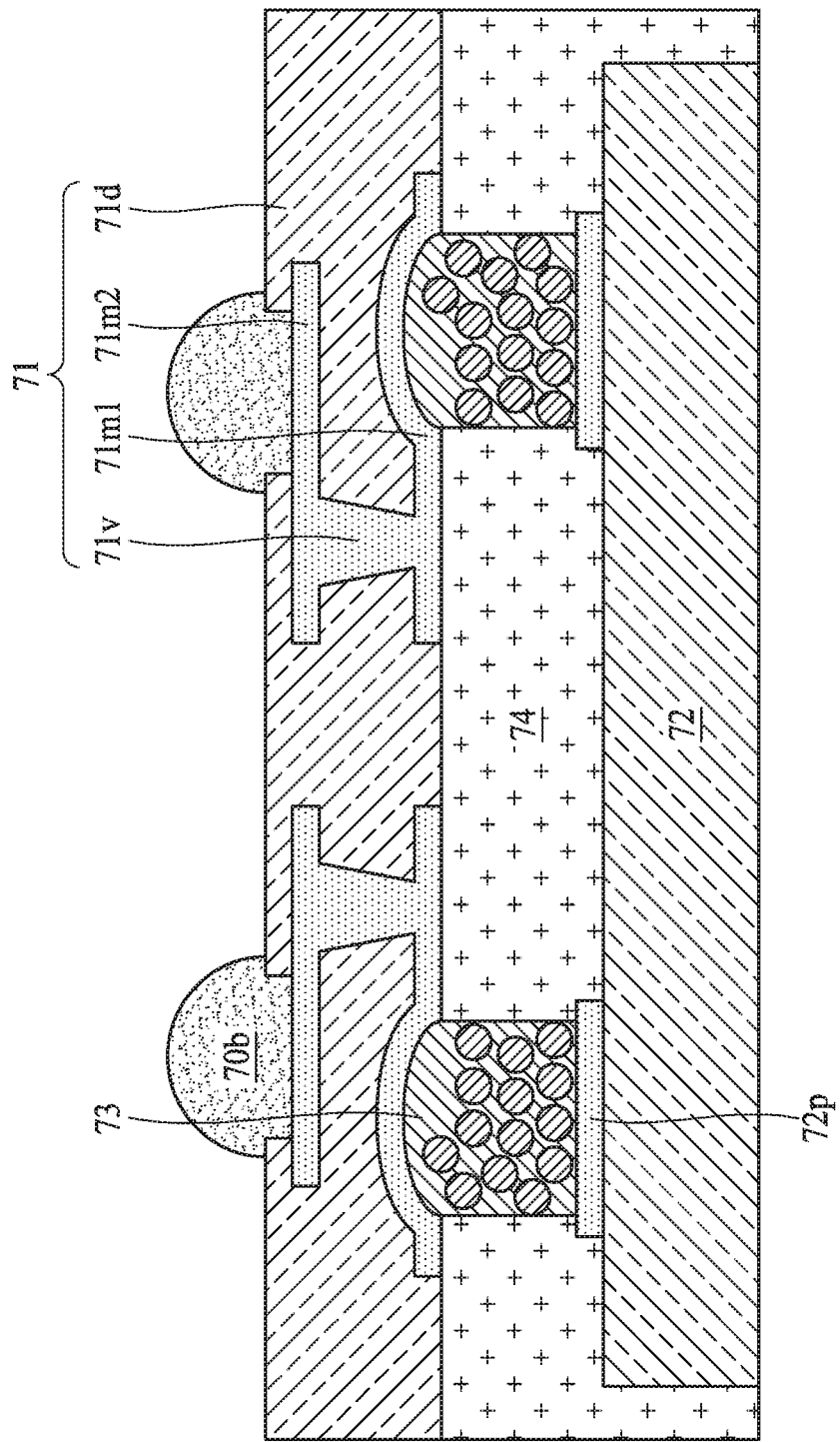

Referring to FIG. 7E, the dry-film 78 is removed from the conductive pillar 73 to expose a portion of the conductive pillar 73. An RDL 71 is formed or disposed on the isolation layer 74 and electrically connected to the exposed portion of the conductive pillar 73. In some embodiments, the RDL 71 includes a dielectric layer 71d and conductive layers 71m1, 71m2 (or metal layers) encapsulated or covered by the dielectric layer 71d. The conductive layers 71m1, 71m2 are electrically connected through conductive interconnections 71v (e.g., vias). In some embodiments, the conductive layers 71m1, 71m2 are formed or disposed by a thermal spraying technique in which melted (or heated) materials are sprayed onto a surface. In some embodiments, the RDL 71 may include any number of dielectric layers and conductive layers according to several different embodiments. For example, the RDL 71 may include N dielectric layers and conductive layers, where N is an integer. The conductive layer 71m2 is exposed from the dielectric layer 71d. An electrical contact 70b is then disposed on the exposed portion of the conductive layer 71m2 to form the semiconductor package device 6 as shown in FIG. 6. In some embodiments, the method illustrated in FIGS. 7A-7E may be referred to as a "chip-first" process.

Figure 8:
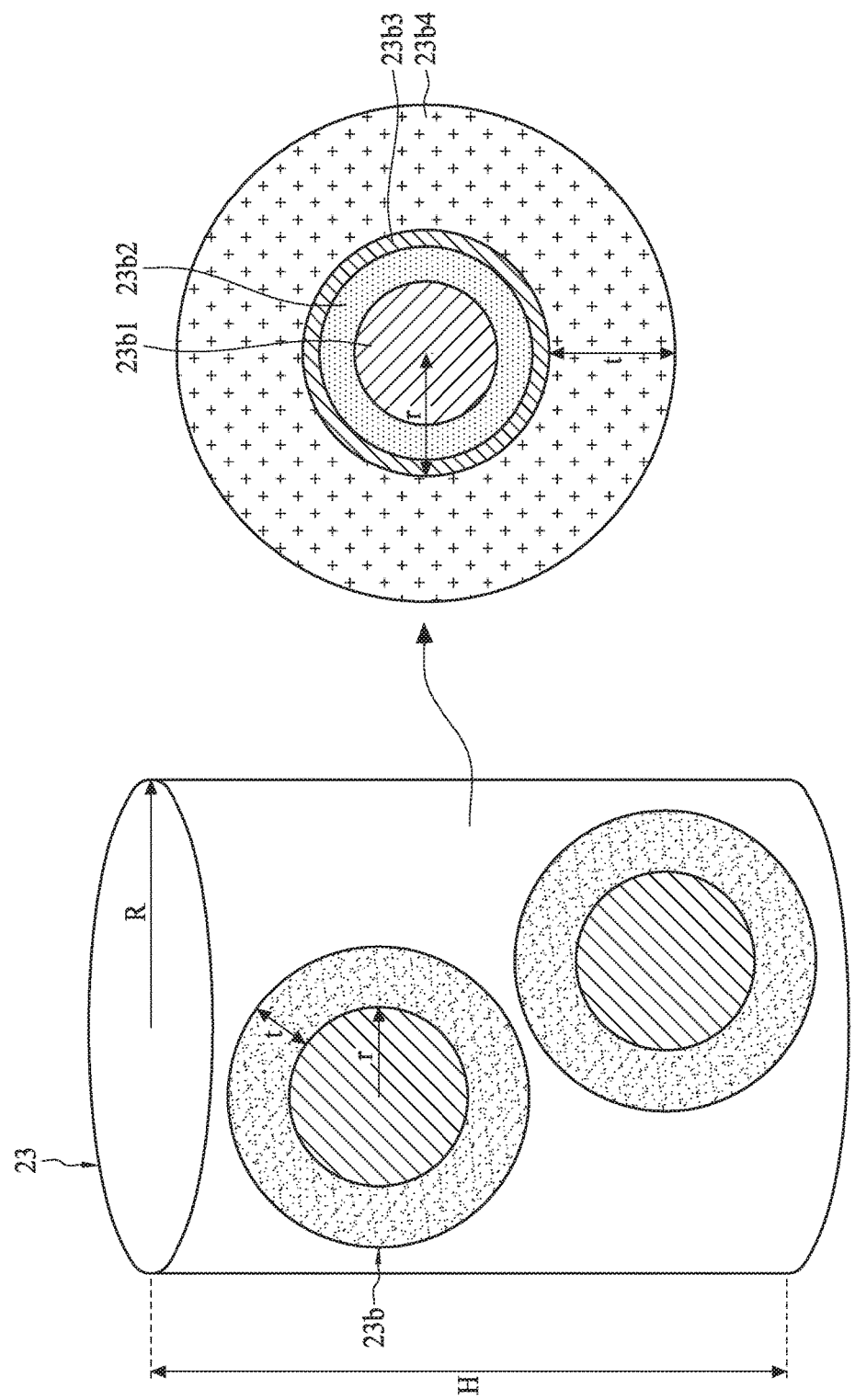
FIG. 8 illustrates a method for calculating a relationship between a conductive pillar and conductive particles as shown in FIGS. 3A and 3B in accordance with some embodiments of the present disclosure.

FIG. 8 illustrates a method for calculating a relationship between the conductive pillar 23 and the conductive particles 23b as shown in FIGS. 3A and 3B, according to some embodiments of the present disclosure. As shown in FIG. 8, the radius of a top surface of the conductive pillar 23 is represented by R, the height of the conductive pillar 60 is represented by H, a distance between the center of the metal core 23b1 and an outer surface of the first conductive layer 23b3 is represented by r and a distance between the outer surface of the first conductive layer 23b3 and an outer surface of the second conductive layer 23b4 is represented by t.

The volume Vp of the conductive pillar 23 is:

$$Vp=\pi R^2 \times H \qquad \text{Eq. (1)}$$

The volume Vs of one conductive particle 23b is:

$$Vs=4\pi(r+t)^3/3 \qquad \text{Eq. (2)}$$

To confine all n conductive particles 23b within the conductive pillar 23, the following condition should be satisfied:

$$n \times 4\pi(r+t)^3/3 \leq \pi R^2 \times H \qquad \text{Eq. (3)}$$

After calculation, the relationship between the conductive pillar 23 and the conductive particles 23b can be derived as follows:

$$0 < t \leq -r + \sqrt[3]{\frac{3HR^2}{4n}} \text{ and } 1 \leq n \leq (3HR^2)/(4r^3) \qquad \text{Eq. (4)}$$

Assuming about 5 micrometers (nm)≤R≤about 50 nm, about 0.05 nm≤r≤about 5 nm, about 0.04 μm≤t≤about 10 μm, a ratio of t to r (e.g., t/r) is from about 0.04 to about 110.0 and a ratio of a sum of volumes of the metal core 23b1, the barrier layer 23b2 and the first conductive layer 23b3 to a volume of the second conductive layer 23b4 is from about 0.1 to about 200. In some embodiments, $1 \leq (3H(R \times k_f)^2)/(4r^3)$, where about $0.2 < k_f \leq$ about 1.2 and about 5 μm≤R×$k_f$≤about 50 μm, about 0.05 μm≤r≤about 5 μm.

Figure 9B:
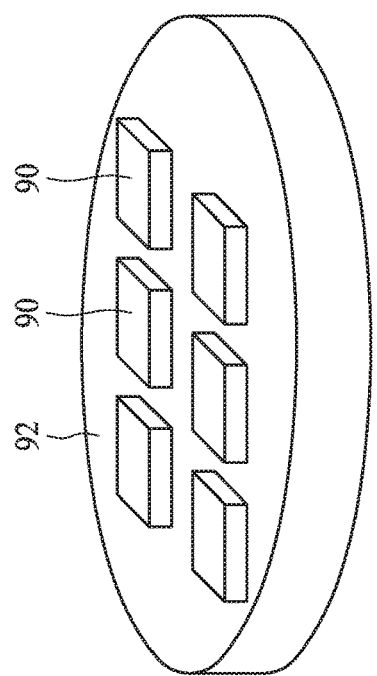
FIG. 9A and FIG. 9B illustrate different types of semiconductor package devices in accordance with some embodiments of the present disclosure.
Figure 9A:
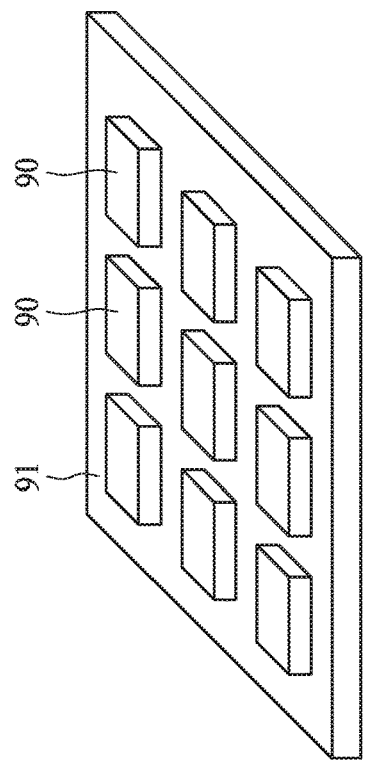

FIGS. 9A and 9B illustrate different types of semiconductor package devices in accordance with some embodiments of the present disclosure.

As shown in FIG. 9A, a plurality of chips 90 or dies are placed on a square-shaped carrier 91. In some embodiments, the carrier 91 may include organic materials (e.g., molding compound, BT, PI, PBO, solder resist, ABF, PP or epoxy-based material) or inorganic materials (e.g., silicon, glass, ceramic or quartz).

As shown in FIG. 9B, a plurality of chips 90 or dies are placed on a circle-shaped carrier 92. In some embodiments, the carrier 92 may include organic materials (e.g., molding compound, BT, PI, PBO, solder resist, ABF, PP or epoxy-based material) or inorganic materials (e.g., silicon, glass, ceramic or quartz).

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A conductive particle, comprising:
   a metal core;
   a barrier layer surrounding the metal core;
   a first conductive layer surrounding the barrier layer; and
   a second conductive layer surrounding the first conductive layer,
   wherein a ratio of a sum of volumes of the metal core, the barrier layer and the first conductive layer to a volume of the second conductive layer is from about 0.1 to about 200.

2. The conductive particle of claim 1, wherein a ratio of a thickness (t) of the second conductive layer to a distance (r1) between a center of the metal core and an outer surface of the first conductive layer is from about 0.04 to about 110.

3. The conductive particle of claim 2, wherein about 0.05 micrometers (μm)≤r1≤about 5 μm and about 0.04 μm≤t≤about 10 μm.

4. The conductive particle of claim 1, wherein the metal core comprises copper (Cu), silver (Ag), gold (Au), platinum (Pt) or a combination of two or more thereof.

5. The conductive particle of claim 1, wherein the barrier layer comprises nickel (Ni), titanium (Ti), tungsten (W), or a combination of two or more thereof.

6. The conductive particle of claim 1, wherein the first conductive layer comprises Cu, Ag, Au, Pt, or a combination of two or more thereof.

7. The conductive particle of claim 1, wherein the second conductive layer comprises tin (Sn), Ag, or a combination thereof.

8. A semiconductor device package, comprising:
   a carrier;
   a first electronic component over the carrier;
   a conductive element on the carrier and electrically connecting the first electronic component to the carrier, wherein the conductive element comprises at least one conductive particle and a solder material covering the conductive particle, and the conductive particle comprises a metal core, a barrier layer covering the metal core, and a metal layer covering the barrier layer; and
   a redistribution layer (RDL) having a first surface on which the first electronic component is disposed and a second surface opposite to the first surface, wherein the conductive element is electrically connected to the second surface of the RDL.

9. The semiconductor device package of claim 8, wherein the carrier comprises a conductive via penetrating the carrier, and the conductive via comprises at least one conductive particle and a solder material covering the conductive particle.

10. The semiconductor device package of claim 8, further comprising a second electronic component disposed on the second surface of the RDL, wherein the second electronic component comprises electrical contacts electrically connecting the second electronic component to the RDL.

11. The semiconductor device package of claim 10, wherein a melting point of the conductive element is greater than a melting point of the electrical contacts of the second electronic component.

12. The semiconductor device package of claim 10, further comprising a first package body covering the conductive element and the second electronic component.

13. The semiconductor device package of claim 12, further comprising a second package body covering the first package body and the first electronic component.

14. A semiconductor device package, comprising: a carrier having a first surface and comprising a conductive pad on the first surface of the carrier; and a conductive element comprising a plurality of conductive particles surrounded by a solder material, the conductive element disposed on the conductive pad of the carrier, wherein a portion of the conductive element is covered by the conductive pad; wherein: the conductive element has a thickness (H) and a radius (R); each of the conductive particles has a radius (r); and $1 \leq (3H(R \times k_f)^2)/(4r^3)$, where about $0.2 < k_f \leq$ about 1.2.

15. The semiconductor device package of claim 14, wherein each of the conductive particles comprises a metal core, a barrier layer covering the metal core and a metal layer covering the barrier layer.

16. The semiconductor device package of claim 15, wherein the portion of the conductive element covered by the conductive pad comprises the conductive particles.

17. The semiconductor device package of claim 16, wherein the portion of the conductive element covered by the conductive pad comprises the solder material.

18. The semiconductor device package of claim 14, wherein about 5 micrometers ($\mu$m)$\leq R \times k_f \leq$ about 50 $\mu$m, about 0.05 $\mu$m$\leq r \leq$ about 5 $\mu$m.

* * * * *